United States Patent [19]
Brooks et al.

[11] Patent Number: 5,847,600
[45] Date of Patent: *Dec. 8, 1998

[54] MULTI-STAGE HIGH-GAIN HIGH-SPEED AMPLIFIER

[75] Inventors: Todd L. Brooks, Boston; Lawrence Singer, Bedford, both of Mass.

[73] Assignee: Analog Devices, Inc., Norwood, Mass.

[ * ] Notice: This patent issued on a continued prosecution application filed under 37 CFR 1.53(d), and is subject to the twenty year patent term provisions of 35 U.S.C. 154(a)(2).

[21] Appl. No.: 638,287

[22] Filed: Apr. 26, 1996

[51] Int. Cl.⁶ .................................................. H03F 3/45
[52] U.S. Cl. ........................ 330/9; 330/51; 330/253; 330/258; 330/311
[58] Field of Search ............................... 330/9, 51, 253, 330/258, 311

[56] References Cited

U.S. PATENT DOCUMENTS 5,084,639  1/1992  Ribner .................... 330/9 X
5,442,318  8/1995  Badyal et al. ............. 330/253

Primary Examiner—James B. Mullins
Attorney, Agent, or Firm—Wolf, Greenfield & Sacks, P.C.

[57] ABSTRACT

A two-stage switched-capacitor residue amplifier having novel circuitry in the first and second stages provides fast and accurate settling while configured with a large closed-loop gain, and also provides low power consumption while powered from a five volt supply. The invention is particularly well suited for use in a multi-stage, pipe-lined analog-to-digital converter (ADC) that converts multiple bits in the first pipeline stage. Complementary PMOS and NMOS differential pairs are used in the first and/or second stage to increase the current slew capability of the amplifier. Current mirror gain and/or positive feedback is used in the second stage to increase transconductance and bandwidth. Cascode transistors are used in the output of the first and/or second stages and active cascode gain enhancement is used in the first stage to increase dc gain and accuracy. The common mode level at the output of the second stage is controlled by injecting a pair of control currents (representative of the difference between a common-mode level actually at the output of the second stage and a desired common mode level) into a pair of mirror input nodes in the second stage. The common mode level of the first stage is controlled from a common node of a differential pair of the second stage. The two-stage amplifier of the invention provides a gain band-width product of 800 MHz, a closed-loop bandwidth of 50 MHz, a dc gain 90 dB, and a power consumption 80 mW.

34 Claims, 19 Drawing Sheets

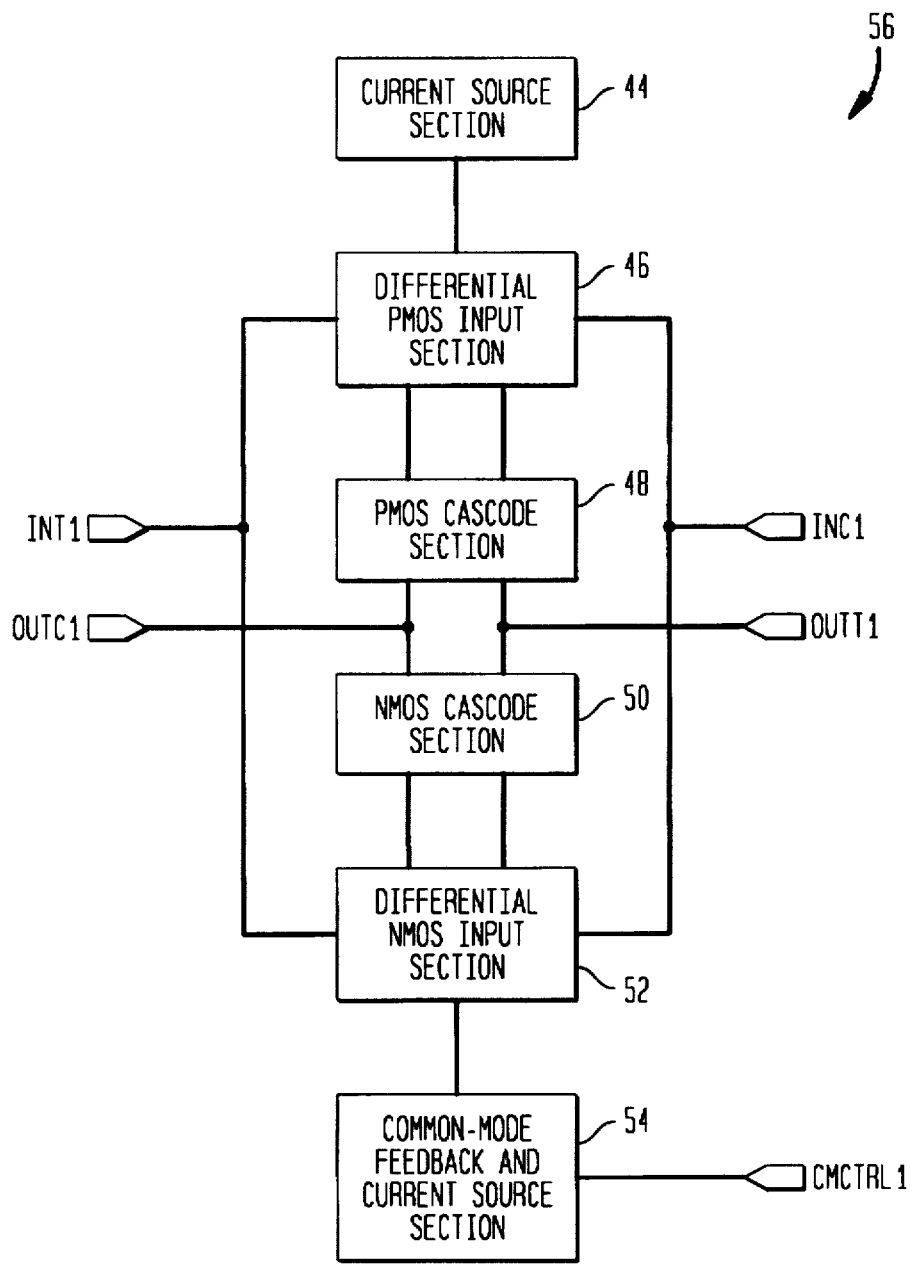

5,847,600

MULTI-STAGE HIGH-GAIN HIGH-SPEED AMPLIFIER

FIELD OF THE INVENTION

The present invention relates generally to electronic amplifier circuits, and more particularly, to a multi-stage amplifier circuit with high-gain, high slew capability and high closed-loop bandwidth. The invention is particularly well suited for use as a residue amplifier in a multi-stage pipelined analog-to-digital converter (pipelined ADC).

BACKGROUND OF THE INVENTION

A pipelined ADC is shown generally at 209 in FIG. 19. A pipelined ADC generally includes an input sample and hold circuit (SHA) 210 and several pipeline stages (211 and 214), (212 and 215) and (213 and 216). Each pipeline stage generally comprises a flash analog-to-digital converter (flash ADC) 214, 215, 216 and 217 and a residue amplifier 211, 212 and 213. Each residue amplifier 211, 212 and 213, in turn, includes at least one amplifier stage, a digital-to-analog converter (DAC), as well as a sample and hold function. The inter-relationship among these components is explained below.

The SHA 210 samples a signal at the input of the pipelined ADC 209 and holds this signal at its output long enough to allow a first stage of the pipeline 211 and 214 to operate on it. This first stage 211 and 214 includes a first-stage flash ADC 214 and a first-stage residue amplifier 211. The first-stage flash ADC 214 quantizes the sampled signal and provides an n-bit digital word. This word represents the amplitude of the sampled signal (relative to the flash ADC reference voltage), accurate to n-bits. The first-stage DAC (within residue amplifier 211) then accepts the n-bit word from the first-stage flash ADC 214 and converts the word back into analog format. The first-stage residue amplifier 211 measures the amplitude difference between the sampled signal and the n-bit approximation of the sample as supplied by the DAC (within residue amplifier 211). This difference is termed the first-stage "residue," as it represents the portion of the signal beyond the resolution of the first n-bit conversion. The first-stage residue amplifier 211 then amplifies the first-stage residue by a factor of $2^n$, and holds the amplified first-stage residue while it is processed in the second stage of the pipeline 212 and 215.

In the second pipeline stage 212 and 215, a second-stage flash ADC 215 quantizes the amplified first-stage residue into an m-bit digital word (i.e., accurate to m-bits). A second-stage DAC (within residue amplifier 212) converts the m-bit digital word back into analog format, and the second-stage residue amplifier 212 measures the difference between the actual amplified residue from the first-stage residue amplifier 211 and the analog output of the second-stage DAC (within residue amplifier 212). This difference represents the residue from the second-stage flash ADC 215 and is further amplified by a factor of $2^m$ to provide an amplified second-stage residue. This amplified second-stage residue is then held by the second-stage residue amplifier 212 while it is processed in the following stage of the pipeline. This process may be continued with additional pipeline stages as required to achieve the desired resolution. A digital adder 218 combines the outputs of flash ADCs 214, 215, 216 and 217 and provides a digital output to output bus 219.

Thus, after the first two pipeline stages, an (m+n) bit digital word (accurate to (m+n) bits), is obtained. In other words, the first stage provides a rough measurement of the sampled signal (accurate to a finite number of bits), and each successive stage fine tunes that measurement. In many practical implementations an amplification factor of less than $2^n$ in the first stage and less than $2^m$ in the second stage is implemented so that some form of digital correction can be used to correct errors in the flash ADCs. For example, many pipeline converters manufactured today are implemented with residue amplification factors of $2^{n-1}$ and $2^{m-1}$ respectively in the first and second stage residue amplifiers, and provide an m+n−1 bit digital word accurate to m+n−1 bits after the first two pipeline stages.

As applications for pipelined ADCs become more prevalent, users are requiring faster devices with more accurate characteristics. In addition, users desire pipelined ADCs which consume as little power as possible and which are powered from limited voltage rails. The low power requirement makes the "speed" goal difficult to obtain, and the voltage limitation restricts the "voltage swing" headroom available in the device. Therefore, the design of a fast-settling, low-power, limited-voltage pipelined ADC which can take over 100,000 samples/second and have greater than ten-bit accuracy is a challenging task which requires novel and improved circuit implementation.

A major concern in the design of multi-stage pipelined ADCs is the accuracy of the analog-to-digital conversion. A common source of error in pipelined ADCs is inaccuracy of the amplification factor of the residue, commonly referred to as "inter-stage gain error." That is, if the residue is not amplified to a sufficiently accurate level, then the conversion of the amplified residue will not be accurate, and this will cause linearity errors in the overall analog-to-digital transfer function of the ADC. Further, mismatched elements within the DAC (within the residue amplifier) can cause a non-linear digital-to-analog conversion. This may also cause major accuracy errors in the overall analog-to-digital transfer function. Combined, these errors are typically two of the largest sources of dc non-linearity of the overall ADC.

To reduce the effect of inter-stage gain error and element mismatch error within a pipelined converter, complex calibration schemes have been used. One such scheme requires the device to calibrate itself periodically during use, making the device temporarily inoperative during the calibration. Another scheme is to calibrate the device during startup, resulting in inaccuracies during extended periods of use due to power supply drift and temperature variations. And yet another scheme is to require the user to enter a calibration mode periodically, which is burdensome for the user. Further, calibration typically results in a significant die area penalty. Therefore, a pipelined ADC which does not require burdensome calibration of error sources is greatly desired.

One component of a pipelined ADC that particularly affects speed, accuracy, and power consumption is the residue amplifier. An example of a prior art, single-bit switched-capacitor residue amplifier is shown at 40 in FIG. 1. Input voltage $V_{in}$ is applied across positive and negative input nodes $V_{in+}$ and $V_{in-}$. REF+ and REF− represent positive and negative reference voltages, respectively. For each bit of a digital word obtained by a flash ADC, either REF+ or REF− is applied to specific capacitors within the input capacitor array 34. By using appropriately sized capacitors within this array, a proper digital-to-analog conversion is achieved. Because FIG. 1 is a single-bit example, only one set of input capacitors 34 is shown.

Several switches also are shown, each switch being opened or closed depending on the value at a particular time of a switch control signal that controls that switch. The switch control signals φ1, φ1' or φ2 are shown in the timing diagram of FIG. 2, and the control signal controlling the operation of a given switch is shown in FIG. 1 by the symbol φ1, φ1' or φ2 beside the switch. Each switch is closed when its control signal is high. Signals φ1 and φ2 are never high simultaneously. Signal φ1' goes high at the same time as does signal φ1, but it goes low slightly earlier than does signal φ1. In FIG. 2, the horizontal axis represents time and the vertical axis represents the amplitude of the signals. The placement of one signal above another in FIG. 2 is done for convenience of illustration and in no way suggests that one attains a greater amplitude than another. As used herein, phase 1 refers to the time interval when signal φ1 is high and phase 2 refers to the time interval when signal φ2 is high.

From a study of FIG. 1 in conjunction with the timing diagram of FIG. 2, one can appreciate the following. Initially, during phase 1, when the φ1 and φ1' signals are high and the φ2 signal is low, switches 23 and 22 are closed and switches 20 are open. During this interval, the input signal $V_{in}$ is applied to one side of the input capacitor array 34, the amplifier 42 is in unity gain, and ground is applied to one side of capacitors 36. As control signal φ1' transitions from high to low, switches 22 open, the input signal $V_{in}$ is sampled on capacitor array 34, and ground is sampled on capacitors 36. Finally, during phase 2, switches 20 are closed and switches 23 are opened so that capacitors 36 are connected around the amplifier's feedback loop, and REF+ and REF− selectively are connected to the input capacitor array 34, resulting in the residue of the flash ADC conversion (i.e., that portion of the analog sample not accurately represented by the digital sample) being amplified and provided across outputs $V_{out+}$ and $V_{out-}$. Thus, phase 1 is referred to as the unity gain or sampling phase and phase 2 is referred to as the amplification phase.

With a switched-capacitor residue amplifier such as that shown at 40 in FIG. 1, however, a problem is encountered. A large gain-bandwidth is required in amplifier 42 in order to achieve rapid settling of the amplified residue signal during the amplification phase. Amplifier 42 must also be unity-gain stable for operation during phase 1. These two requirements are difficult to achieve simultaneously, particularly when the number of bits in a given stage of the pipeline is two or greater. In this case, the residue amplification factor is greater than unity, and the amplifier gain-bandwidth must be made very large in order to maintain sufficient closed-loop bandwidth during the amplification phase to settle the amplified residue. Although the gain-bandwidth of the amplifier 42 could be altered between the two clock phases, this would likely cause offset errors within the amplifier 42. These offset errors contribute to the overall offset of the A/D converter, which is an undesirable error source.

As a solution to the bandwidth matching problem between phases, a two-stage, switched-capacitor residue amplifier, such as that shown at 30 in FIG. 3, is employed. The timing diagram of FIG. 2 applies to the operation of the switches shown in FIG. 3 in the same manner as it applies to the operation of the switches shown in FIG. 1. FIG. 4(a) represents the two-stage amplifier circuit 30 of FIG. 3 as configured during the sampling phase (i.e., input sample configuration), and FIG. 4(b) represents the circuit 30 as configured during the amplify phase (i.e., amplify configuration). During the sampling phase, the first stage 24 of the residue amplifier 30 is connected in unity-gain feedback and the outputs 28 of the second stage 26 are shorted together. During the amplification phase, the residue amplifier 30 is reconfigured as a two-stage Miller compensated structure. By using this two-stage structure, the gain-bandwidth of residue amplifier 30 can be varied between the sample (i.e., unity gain) and amplify modes of operation without significantly affecting or introducing amplifier offset. Also, the two-stage structure provides an additional degree of freedom. That is, the value of the Miller capacitors 32 may be set independently from the value of the array capacitors 34 and feedback capacitors 36 which load the first stage during the sampling phase. This allows the gain-bandwidth product of the two-stage amplifier structure 30 to be varied in order to obtain optimal settling response during each phase of operation.

A major consideration in the design of a pipelined ADC is the dc gain of the residue amplifiers. This gain must be sufficiently high to ensure that the final settled value of the amplified residue is accurate. The dc gain requirement of the first stage of the pipeline is determined by the overall resolution of the pipeline A/D converter. For example, a 12-bit pipelined converter typically requires a first-stage amplifier with between 70 dB and 90 dB of dc gain.

Another major consideration in the design of a pipelined ADC is speed. The speed of the amplifier is determined by the combination of its slew capability and its closed-loop bandwidth. In the case of the two-stage residue amplifier 30, the first stage 24 must be capable of slewing the voltage on the input capacitor array 34 during phase 1 (i.e., input sample configuration), and the second stage 26 must be able to slew the voltage on the input capacitor array of the succeeding pipeline stage, as well as the Miller capacitor 32, during phase 2 (i.e., amplify configuration). As one skilled in the art will appreciate, an overly large slew capability in the first-stage of a two-stage amplifier can cause large-signal settling problems. Specifically, the second stage 26 of FIG. 4 must have a slew capability that is larger than the input stage by a factor of at least $(1+C_{load}/C_C)$, where $C_C$ is the value of the Miller capacitance and $C_{load}$ is the value of the total capacitance of the input capacitor array of the succeeding pipeline stage.

As mentioned, the amplifier speed is also determined by the closed-loop bandwidth. In a two-stage Miller compensated residue amplifier such as that shown at 30 in FIGS. 3, 4(a) and 4(b), two factors determine the closed-loop bandwidth of the circuit. The first factor is the gain-bandwidth of the entire two-stage Miller-compensated structure 30. This gain-bandwidth (GBW) is determined by dividing the transconductance of the first stage amplifier 24 (gm1) by the value of the Miller capacitor 32 ($C_c$) (i.e., GBW=gm1/$C_C$). The second factor is the feedback gain factor (Beta) of the feedback network applied around the amplifier. The closed-loop bandwidth (BW) of the circuit equals the gain-bandwidth (GBW) times the feedback gain factor (Beta) (i.e., BW=GBW*Beta).

In addition to these two factors which determine the closed-loop bandwidth of the amplifier, there are additional factors which determine the stability of the two-stage amplifier and ultimately limit the speed of the amplifier. For example, the closed-loop bandwidth of the amplifier can not be increased to the point where it is greater than the bandwidth of a second-stage 26 without incurring a settling penalty due to a severely under-damped settling response. Consequently, the additional factors which determine the stability of the amplifier also influence the speed of the amplifier.

An important factor affecting stability is the bandwidth of the second stage 26 ($BW_2$). This bandwidth is calculated by dividing the transconductance of the second stage 26 (gm2) by the total capacitance loading the output of the second stage ($C_L$) and multiplying by the feedback gain factor around the second stage ($Beta_2$) (i.e., $BW_2 = gm2/C_L * Beta_2$). This feedback gain around the second stage is calculated by dividing the value of the Miller capacitor ($C_c$) by the sum of both the parasitic capacitance present at the output of the first stage 24 and at the input of the second stage 26 ($C_P$) and the value of the Miller capacitor ($C_c$) (i.e., $Beta_2 = C_c/(C_P + C_c)$). Because capacitance $C_L$ essentially is fixed and because $Beta_2$ can not be made greater than unity, gm2 must be sufficiently high to ensure that the second-stage bandwidth is greater than the two-stage closed-loop bandwidth. Furthermore, because $C_P$ is typically difficult to reduce without also decreasing gm2, the minimum value of $C_c$ which does not cause a significant decrease in $Beta_2$ is limited. With this limitation on the minimum value of $C_c$, gm1 must be sufficiently high to achieve the desired closed-loop bandwidth of the two-stage amplifier. This becomes increasingly difficult as the number of bits in a pipeline stage are increased and the residue amplification factor of the stage and the resulting closed-loop gain of the amplifier are increased.

Therefore, a circuit is desired which can significantly increase the transconductance and slew capability of the amplifiers 24 and 26 while providing a minimal value of parasitic capacitance $C_P$, and thereby increase the bandwidth of the two-stage amplifier circuit 30, which can provide high dc gain and settling accuracy, but which can operate in a limited headroom environment (i.e., with limited rail-to-rail supply voltage), and which consumes a minimum amount of power.

A final consideration in designing a residue amplifier for a pipelined ADC is how to maintain the common-mode level of a differential signal at its optimum level. The common-mode level should be adjusted dynamically in order to maximize headroom at the output of the amplifiers. Therefore, a common-mode feedback circuit should (1) be fast, (2) maintain stability between both phase 1 and phase 2 of the switched capacitor circuitry (which entails maintaining a relatively constant bandwidth during each phase), and (3) have an appreciable current drive capability in order to settle the output common-mode of the amplifier quickly and accurately.

Thus, a general object of the present invention is to provide an amplifier that has a high dc gain, high-bandwidth and a substantial current slew capability, but that consumes a minimum amount of power and operates from limited voltage rails. An additional object of the present invention is to provide an amplifier that has a high gain-bandwidth in order to achieve fast settling in a high closed-loop gain configuration, such as that required in a residue amplification stage implemented with a large number of bits and a large residue amplification factor. Furthermore, an object of the present invention is to provide fast and efficient common-mode control for these amplifiers.

SUMMARY OF THE INVENTION

The present invention is a multi-stage amplifier circuit. According to one aspect of the invention, the circuit includes first and second amplifiers. The two-stage amplifier thus formed is configurable to sample an input signal during a first time interval and to amplify a residue signal during a second time interval. The second amplifier is coupled to the output of the first amplifier, and the first and/or the second amplifier includes a complementary pair of oppositely doped input transistors having a common input node. The circuit also includes at least one switch coupled to at least one of the amplifiers that is configurable to switch the amplifier circuit between the input sample configuration and the amplify configuration.

According to another aspect of the invention, the first and/or the second amplifier also includes a differential pair of commonly doped input transistors coupled at a common current electrode.

According to another aspect, the first and/or the second amplifier has a cascode transistor coupled to an output of an input device therein. By doing this, the cascode transistor increases the output impedance of the first and/or second-stage amplifier. According to yet another aspect, the first amplifier has a third amplifier coupled to the cascode transistor so as to increase the output impedance of the cascode transistor. And according to another aspect, the third amplifier is biased relative to the input signal or to a signal at a common current electrode of a differential input pair.

According to a further aspect, the second amplifier has a current mirror coupled to the output of an input device therein.

According to yet another aspect of the invention, the second amplifier controls the common-mode of the first amplifier from a common current electrode of a differential input pair in the second amplifier. And according to another aspect, the common mode circuit switches between configurations having different bandwidths.

According to another aspect, the common-mode of the second stage is controlled by injecting a pair of currents into the input nodes of a pair of current mirrors in the second stage. These currents are proportional to the difference between the common-mode level of the output of the second stage and a preselected common-mode level.

Other objects and advantages of the present invention will become readily apparent to those skilled in this art from the following detailed description in which is shown and described the preferred embodiment of the invention, as well as the best mode contemplated for carrying out the invention. As will be realized, the invention is capable of other and different embodiments, and its several details are capable of modifications in various obvious respects, all without departing from the invention which is defined in scope by the appended claims and their equivalents. Accordingly, the drawings and description are to be regarded as illustrative in nature, and not as limiting.

BRIEF DESCRIPTION OF THE DRAWINGS

For a more complete understanding of the objects and advantages of the present invention, the Detailed Description of the invention is to be read with reference to the following drawings, in which:

FIG. 5 is a block diagram showing one embodiment of the first amplifier;

DETAILED DESCRIPTION OF THE INVENTION

Figure 1:
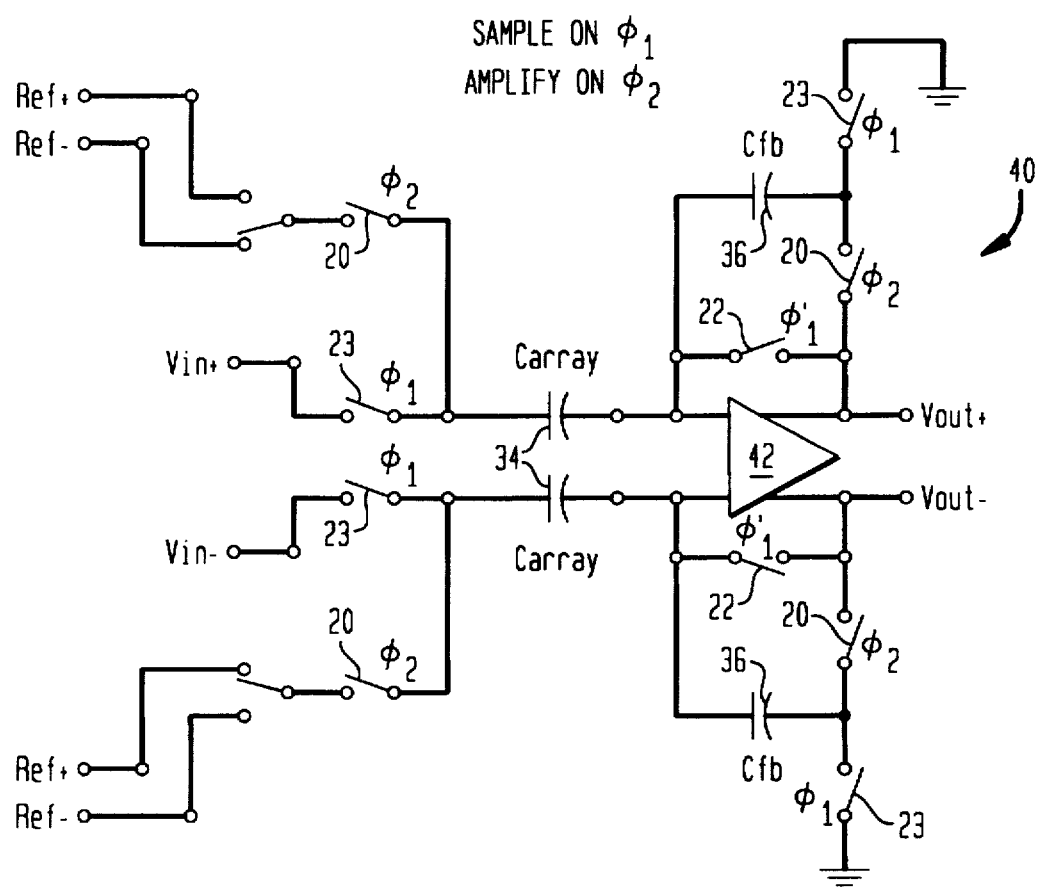
FIG. 1 is a schematic of a prior art single-bit, single-stage switched capacitor residue amplifier.
Figure 2:
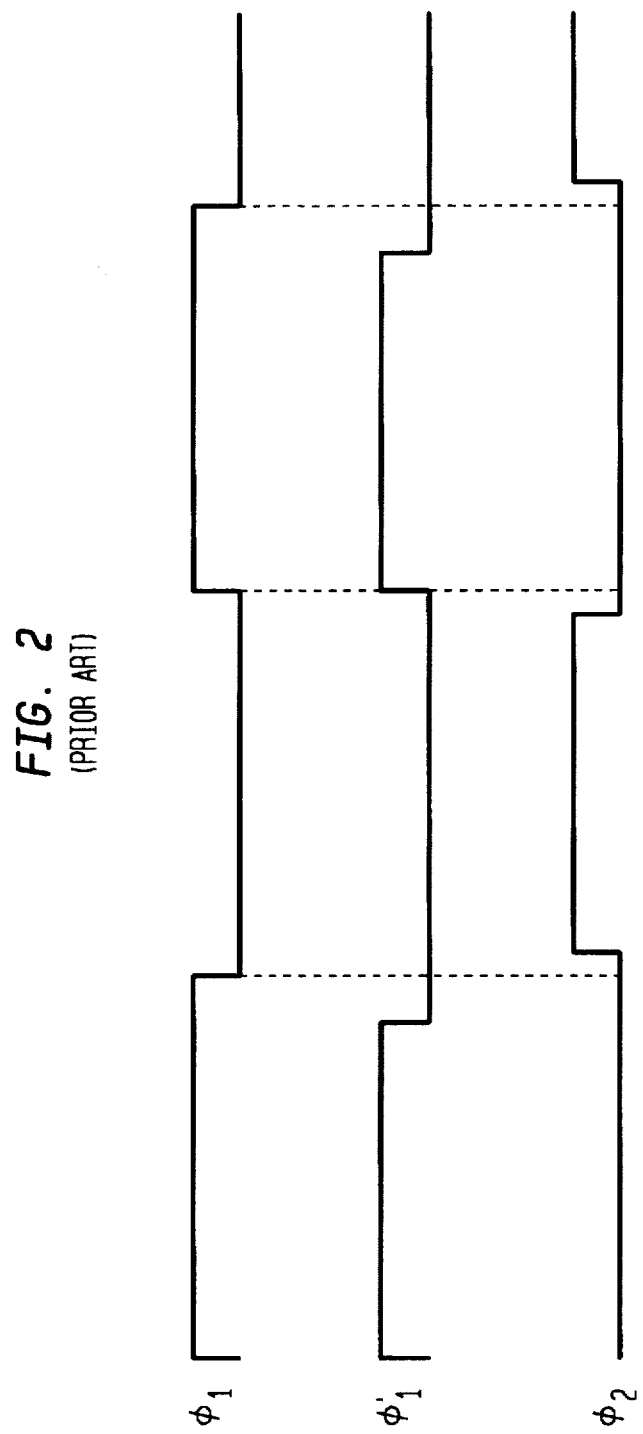
FIG. 2 is a waveform diagram showing signals that control the switches shown in FIGS. 1 and 3.

Broadly speaking, the present invention discloses circuitry internal to a two-stage amplifier that enables such an amplifier to sample an input voltage and amplify the residue of a multiple-bit analog-to-digital conversion quickly, accurately, within a limited headroom environment and with minimum power consumption. Circuitry for first and second amplifiers (i.e., each of the two stages) is disclosed herein, as well as common-mode control circuitry for controlling the common-mode level in the second stage and between the two stages.

The recent trend in pipelined ADCs has been to decrease the number of bits per stage in the pipeline. Using fewer bits per stage reduces the value of the gain-bandwidth product that is required for the individual residue amplifiers to operate at a given speed. This lowering of the gain-bandwidth product results in less power consumption per residue amplifier. However, fewer bits per stage increases the number of stages required for a given resolution. Thus, the advantage of reducing the gain-bandwidth requirement of each residue amplifier may be diminished by the additional power consumption needed for an increased number of stages.

In addition, a more serious drawback is that using fewer bits per stage increases the circuit's sensitivity to component matching errors. As discussed previously, if the gain of each residue amplifier is not accurate, the succeeding stage of the pipeline will be performing an analog-to-digital conversion on a voltage that does not accurately represent the residue of the previous stage. A mismatch between the values of the input array capacitors and the feedback capacitor (coupled between the output of the second stage and the input of the first stage) can cause a significant inter-stage gain error. Secondly, component mismatch errors within the residue amplifiers themselves can cause serious problems. One such mismatch error can be found between the capacitors in the input capacitor array. Mismatched input array capacitors will cause linearity errors in the digital-to-analog conversions of digital words from a flash ADC. Even with the best known component matching techniques, these capacitance mismatches are unavoidable. Although component mismatch errors within and between stages can be corrected with calibration techniques, such techniques are imperfect, burdensome and consume valuable die area.

It has been discovered that higher resolution and accuracy can be attained, and the need for calibration eliminated, by converting a greater number of bits per stage of the pipeline. In particular, converting a large number of bits in the first stage reduces the first stage's sensitivity to element matching errors and decreases the gain accuracy requirement of the first stage residue amplifier. In fact, the differential non-linearity (DNL) of the A/D converter appears to improve almost linearly with each bit added to the first stage. Specifically, five bits or more in the first stage is typically required to achieve DNL errors at the twelve to fourteen bit accuracy level for the overall ADC.

Given this discovery, it is desirable to use as many bits as possible in the first stage of a pipelined ADC. However, prior art multi-bit residue amplifiers were unable to achieve the desired accuracy and settling requirements without consuming an appreciable amount of power. The high-performance amplifier disclosed herein achieves the desired multi-bit accuracy and settling requirements with moderate power consumption. Because fewer stages are required in the multi-stage pipelined ADC for which this residue amplifier is designed, the result is lower overall power consumption for the pipelined ADC.

Figure 3:
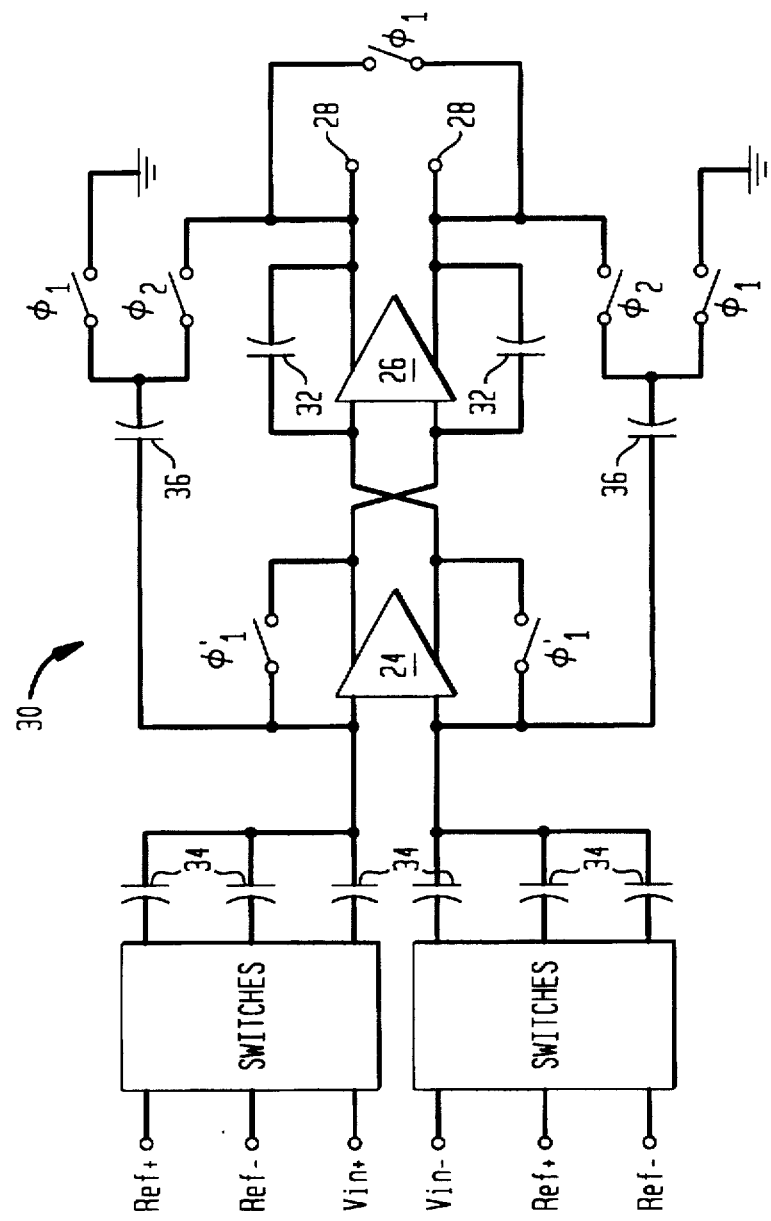
FIG. 3 is a schematic of a two-stage switched-capacitor residue amplifier like the one used in the present invention.
Figure 4A:
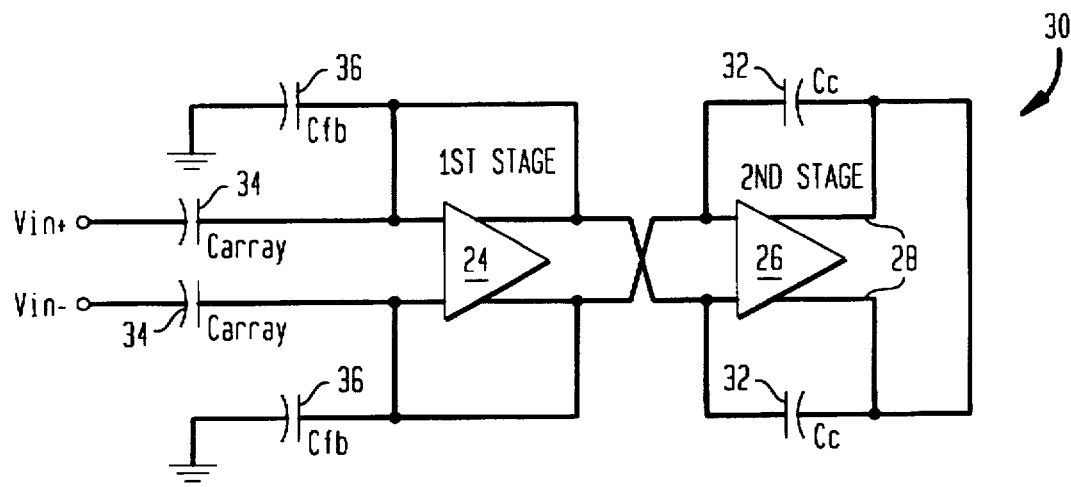
FIG. 4(a) is a schematic representation of the switched capacitor residue amplifier of FIG. 3 while in input sample configuration.
Figure 4B:
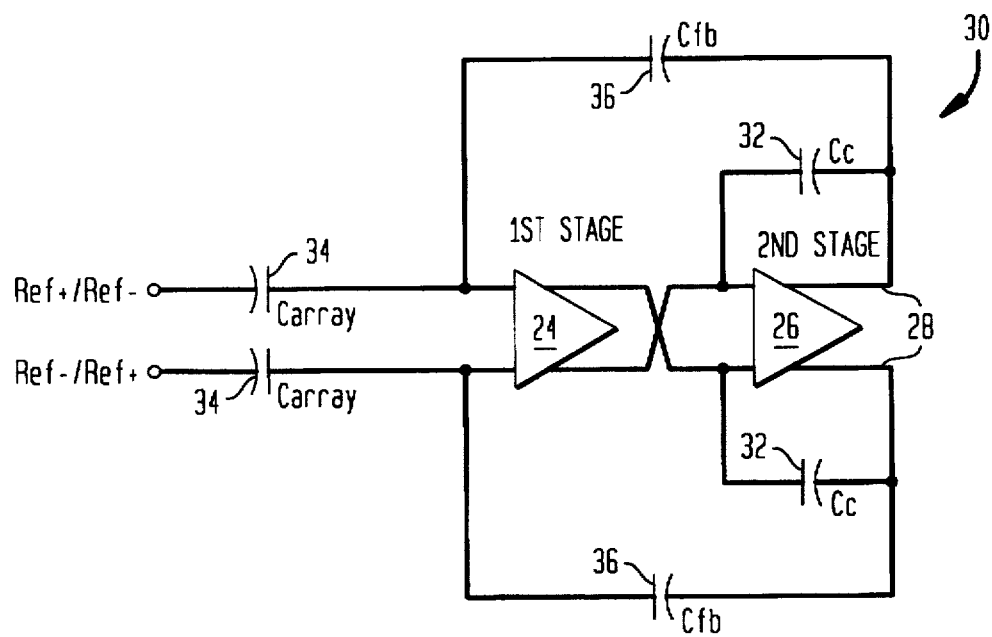
FIG. 4(b) is a schematic representation of the switched capacitor residue amplifier of FIG. 3 while in amplify configuration..

Due to the recognized drawbacks of single-stage, switched-capacitor residue amplifiers, the amplifier circuit of the present invention uses a two-stage, switched-capacitor design, similar to that shown at 30 in FIG. 3. The closed-loop gain of the amplifier circuit (in amplify configuration) as shown at 30 in FIG. 4(a) is determined by dividing the total capacitance of feedback capacitors 36 by the total capacitance of input capacitors 34. In order to convert more bits per stage of a pipelined ADC, a higher closed-loop gain is required. The amplifier of the present invention will support a closed-loop gain of at least eight. Therefore, because the instant amplifier is designed for use in high-speed, low-power, pipelined ADCs capable of converting multiple bits per stage, the internal design of the two stages differs significantly, and necessarily, from the prior art.

Referring to FIG. 5, a block diagram of one embodiment 56 of the first stage 24 of the two-stage amplifier circuit 30 of the present invention is shown. Embodiment 56 has complementary back-to-back PMOS and NMOS differential input sections 46 and 52. This complementary implementation doubles the slew capability of the first stage amplifier without increasing the power consumption. These differential input sections are connected to opposite polarity input nodes INC1 and INT1. Differential input sections 46 and 52 have current source sections 44 and 54 to drive them, respectively. Current source section 54 is controlled (at least in part) by a signal from common-mode control node CMCTRL1. The common-mode control signal applied to node CMCTRL1 may be provided using conventional switched-capacitor common-mode feedback circuitry between the output nodes OUTT1 and OUTC1. This switched-capacitor common-mode feedback circuitry has the disadvantage of adding additional parasitic capacitance, CP, between the two stages. Alternatively, the common-mode control signal applied to node CMTRL1 may be provided by input circuitry in second stage 26. Specifically, a common-source node of a differential pair in the input of second stage 26 may be connected to node CMCTRL1 in order to control the common-mode of first stage 24.

Common-mode control node CMCTRL1 is tied to a common source node 96 (shown in FIG. 9) of an input differential pair in the second stage. Each of the differential input sections 46 and 52 also has a cascode section 48 and 50 connected to its output in order to increase the output impedance of the first stage. These cascode sections 48 and 50 have common output nodes OUTC1 and OUTT1, which are also the output nodes of the first stage. Output nodes OUTC1 and OUTT1 represent opposite polarities of the output of the first stage.

Device sizes (channel width/channel length) for individual transistors shown in the following figures, are depicted adjacent to each transistor. Current source values for individual current sources are also depicted adjacent to each current source. These device sizes and current source values are those used in the preferred embodiment of the invention, but the specific device sizes and current source values are not critical to the invention. Therefore, the device sizes and current source values shown should be regarded as exemplary, rather than limiting.

Figure 6:
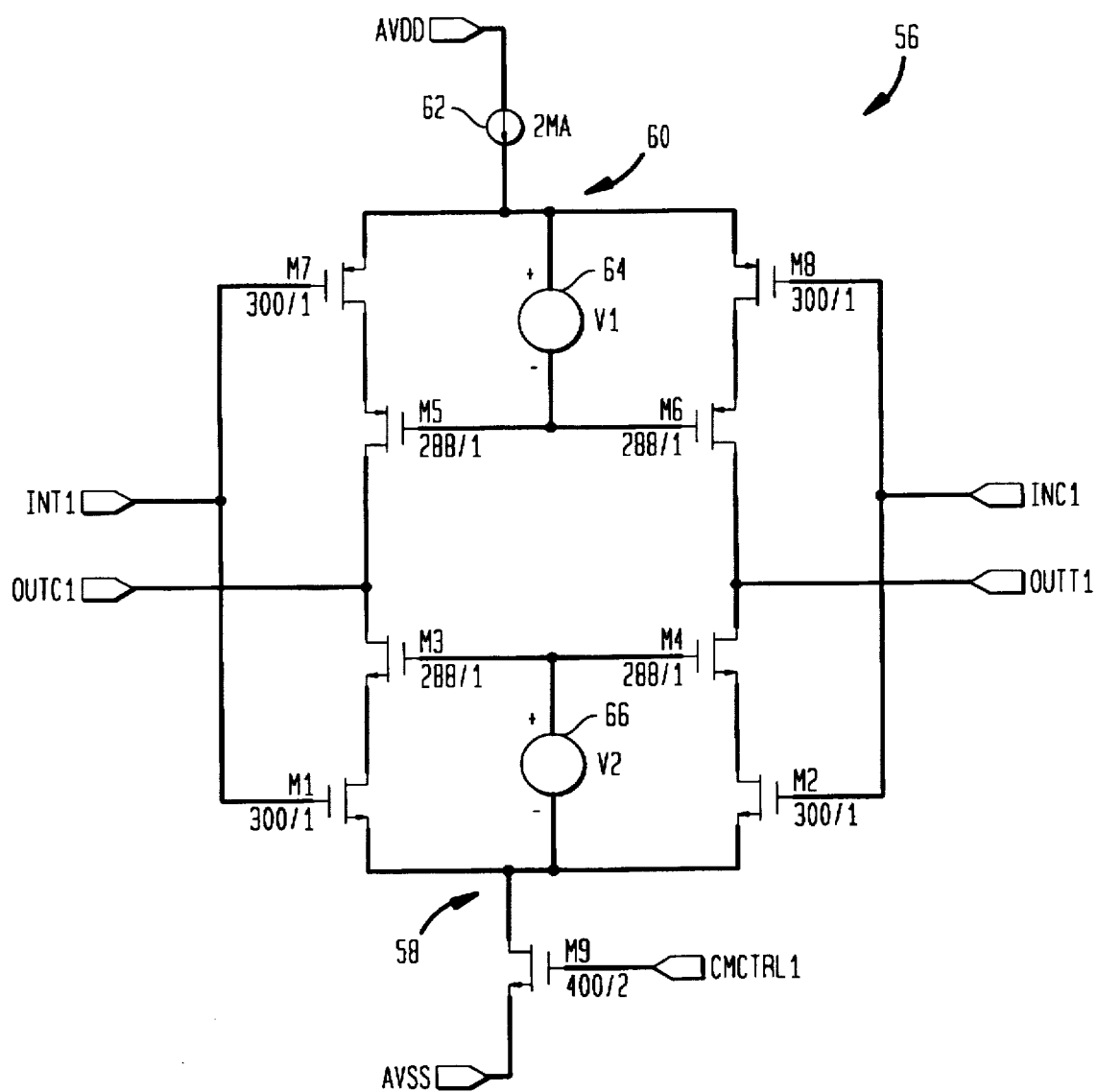
FIG. 6 is a simplified schematic of the embodiment of the first amplifier shown in FIG. 5.

Referring next to FIG. 6, in addition to FIG. 5, a simplified schematic of the circuitry making up the embodiment 56 of the first stage 24 is depicted. The NMOS and PMOS differential input sections 46 and 52 include differential pairs of commonly doped input transistors. Specifically, transistors M1 and M2 make up a differential pair of commonly doped (n-channel) input transistors having a common source node 58 connected to (controlled) current source M9, and transistors M7 and M8 make up a differential pair of commonly doped (p-channel) input transistors having a common source node 60 connected to current source 62. Current source 62 supplies approximately 2 milli-amps (mA) of current and is connected between high voltage supply node AVDD and common source node 60. Current source M9 is an n-channel device that has its source connected to low voltage supply node AVSS, its gate connected to common-mode control node CMTRL1, and its drain connected to common source node 58. A potential of about five volts is applied across supply nodes AVDD and AVSS, with AVSS being taken as the reference node. Together, transistors M1 and M7 comprise a complementary pair of oppositely doped input transistors having a common input node INT1 connected to their gates. Likewise, transistors M2 and M8 comprise a complementary pair of oppositely doped input transistors having a common input node INC1 connected to their gates.

NMOS cascode section 50 includes n-channel cascode transistors M3 and M4, which have source nodes connected to the drain nodes of transistors M1 and M2, respectively. Likewise, PMOS cascode section 48 includes p-channel cascode transistors M5 and M6, which have source nodes connected to the drain nodes of transistors M7 and M8, respectively. The drain nodes of cascode transistors M3 and M5 are connected at output node OUTC1 and the drain nodes of cascode transistors M4 and M6 are connected at output node OUTT1. Additionally, the gates of cascode transistors M3 and M4 are biased by voltage biasing circuit 66 and the gates of cascode transistors M5 and M6 are biased by voltage biasing circuit 64.

The simplicity of this first-stage circuit implementation in FIG. 6, with the current flowing from AVDD through current source 62, through two branches of circuitry formed by M1, M3, M5, M7 on the left and through M2, M4, M6, and M8 on the right, and back into AVSS through transistor M9, ensures that the circuit functions with minimum power consumption while maintaining high slew capability, high transconductance, and high dc gain.

Figure 7:
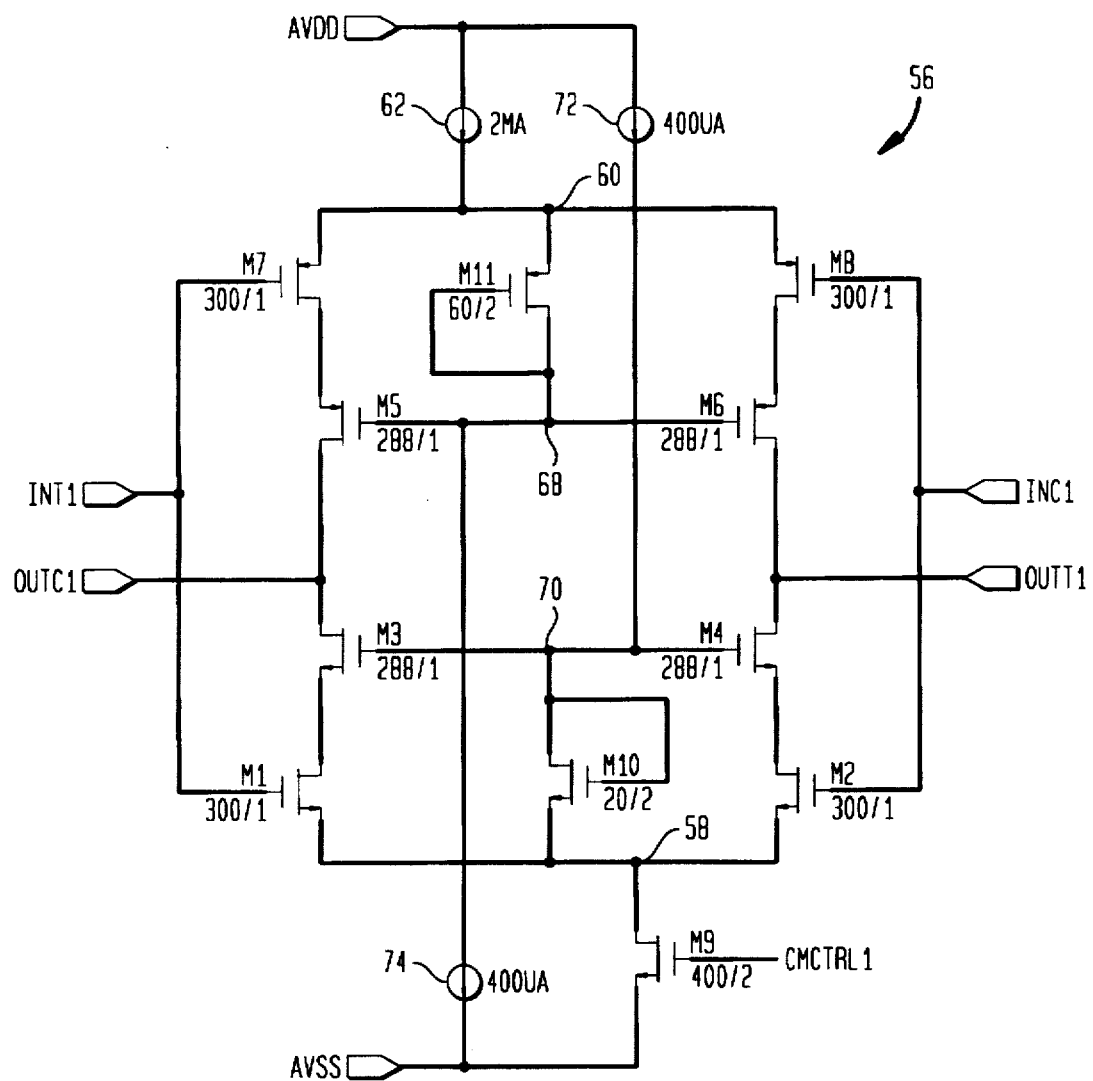
FIG. 7 is a detailed schematic of the embodiment of the first amplifier shown in FIG. 5.

Now referring to FIG. 7, in addition to FIGS. 5 and 6, a detailed circuit diagram of embodiment 56 of the first stage 24 of the two stage amplifier circuit 30 is depicted. Voltage biasing circuit 66 includes n-channel transistor M10 and voltage biasing circuit 64 includes p-channel transistor M11. Transistor M10 has its gate connected to its drain, as well as to circuit node 70. The source of transistor M10 is connected to circuit node 58. Transistor M11 has its gate connected to its drain, as well as to circuit node 68. The source node of transistor M11 is connected to circuit node 60. 400 Micro-Amp (uA) current sources are connected between node AVDD and circuit node 70 and between node AVSS and circuit node 68.

Figure 8:
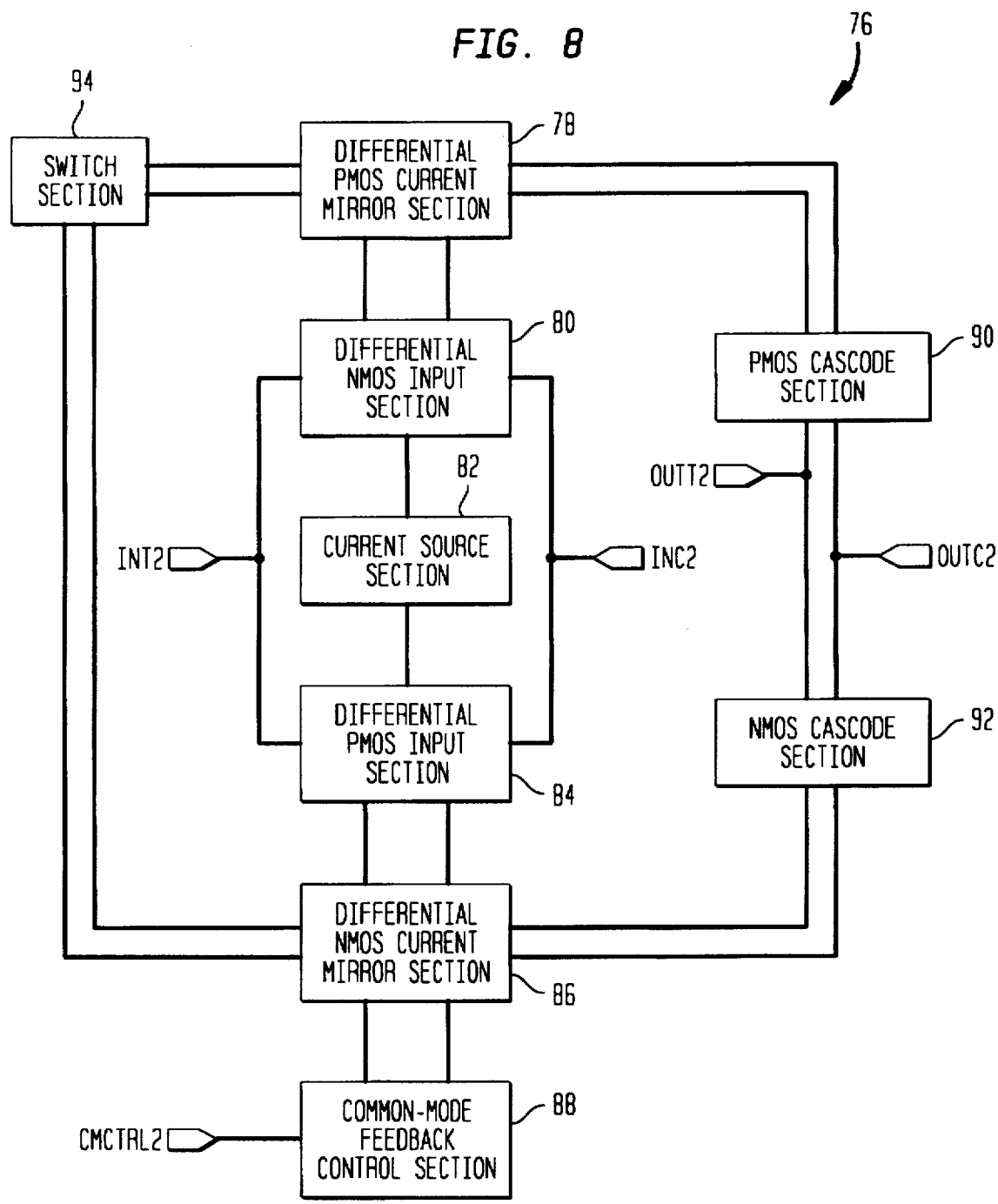
FIG. 8 is a block diagram showing one embodiment of the second amplifier.
Figure 16:
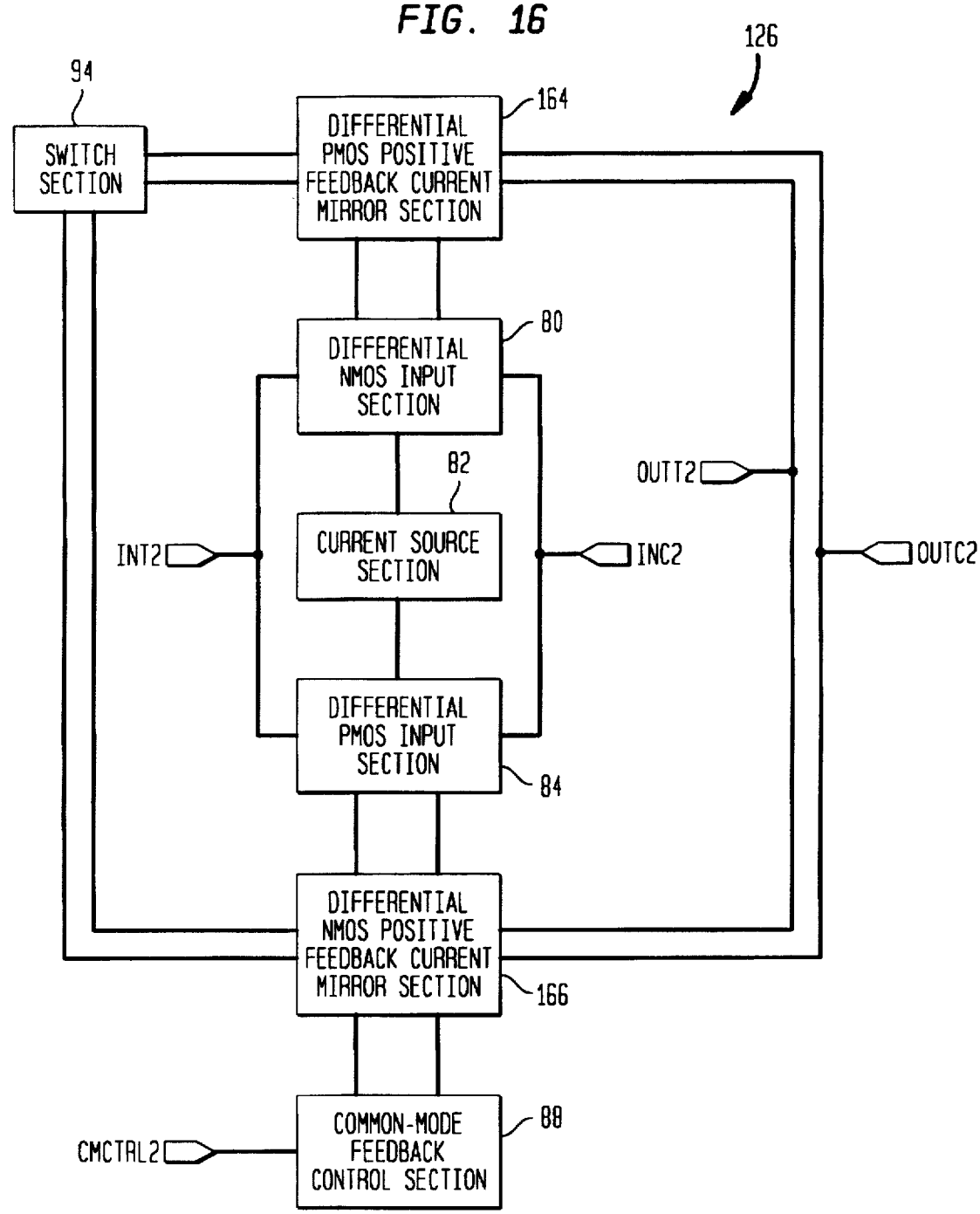
FIG. 16 is a block diagram of another embodiment of the second amplifier.

Now referring to FIG. 8, a block diagram of an embodiment 76 of the second stage 26 of the two stage amplifier circuit 30 is depicted. Opposite polarity input nodes INC2 and INT2 are connected to complementary differential NMOS and PMOS input sections 80 and 84 so as to receive an output signal from the first-stage amplifier. This is accomplished by connecting input nodes INC2 and INT2 to output nodes OUTC1 and OUTT1, respectively, from embodiment 56 of the first stage 24 (shown in FIG. 5) or from embodiment 148 (shown in FIG. 12). Referring still to FIG. 16, both of these differential input sections 80 and 84 are connected to current source section 82. The output of NMOS input section 80 is connected to differential PMOS current mirror section 78 and the output of PMOS input section 84 is connected to differential NMOS current mirror section 86. Switch section 94 is connected to mirror sections 78 and 86. Common-mode feedback control section 88 is connected to input common-mode control node CMCTRL2, and to differential NMOS current mirror section 86. The output of current mirror section 78 is connected to PMOS cascode section 90 and the output of current mirror section 86 is connected to NMOS cascode section 92. The outputs of cascode sections 90 and 92 are connected together at output nodes OUTT2 and OUTC2.

The complementary nature of embodiment 76 of the second stage 26 increases the slew current capability of the circuit without introducing a proportional increase of the power consumption of the circuit. Furthermore, the use of mirror gain in mirror sections 78 and 86 increases the transconductance and slew capability of this amplifier stage without increasing the parasitic capacitance, $C_P$, between first stage 24 and second stage 26 of two-stage amplifier 30. Cascode sections 90 and 92 increase the output impedance of second stage 26 and therefore increase the dc gain of the circuit.

Figure 9:
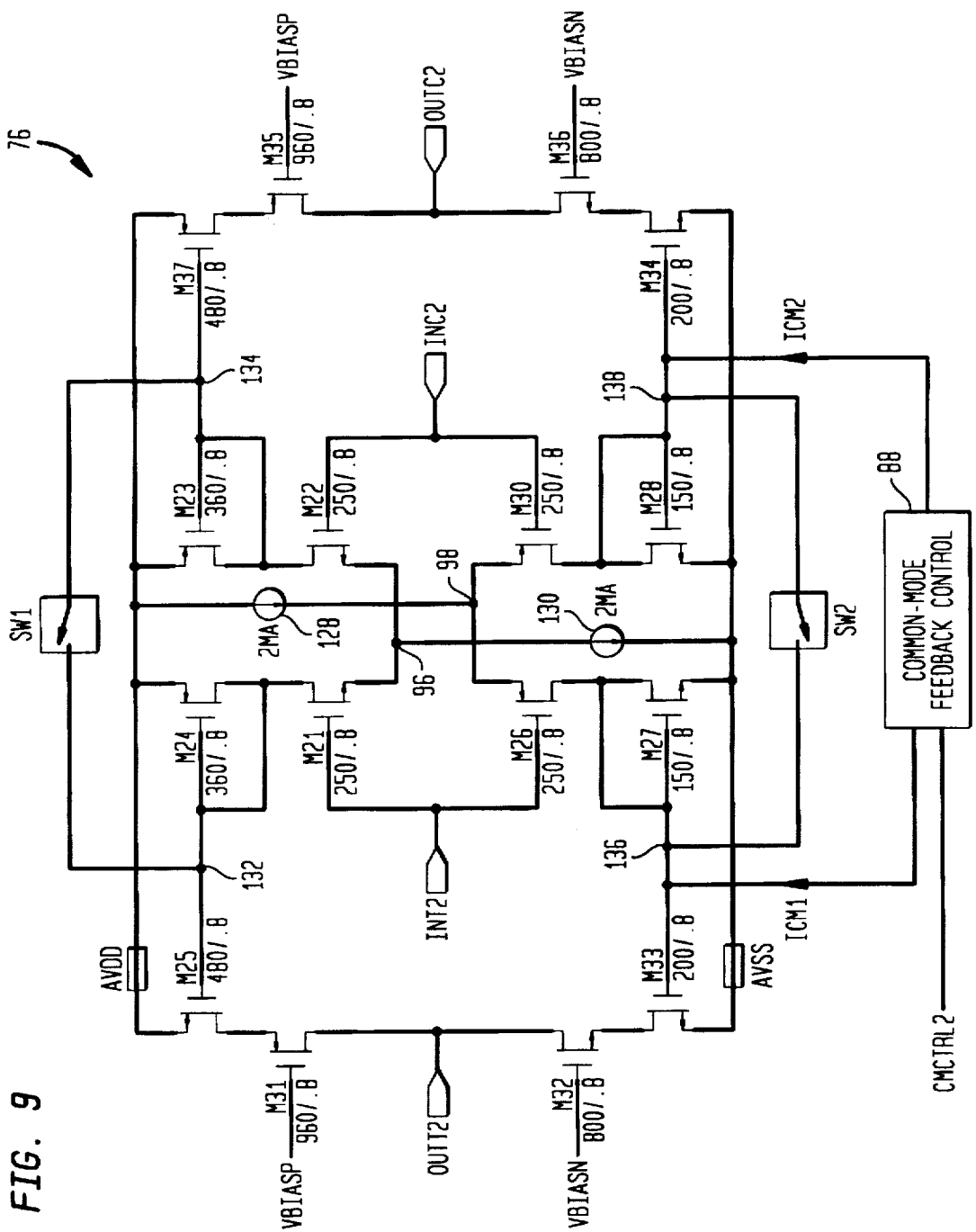
FIG. 9 is a schematic of the embodiment of the second amplifier shown in FIG. 8.

Now referring to FIG. 9, in addition to FIG. 8, a detailed schematic of embodiment 76 of second stage 26 is shown. Differential NMOS input section 80 includes a differential pair of commonly doped (n-channel) input transistors M21 and M22 source connected at a common node 96 and driven by (2 mA) current source 130. Differential PMOS input section 84 includes a differential pair of commonly doped (p-channel) input transistors M26 and M30 source connected at a common node 98 and driven by (2 mA) current source 128. Current sources 128 and 130 comprise current source section 82. Together, transistors M21 and M26 comprise a complementary pair of oppositely doped input transistors having a common input node INT2. Similarly, transistors M22 and M30 comprise a complementary pair of oppositely doped input transistors having a common input node input node INC2.

Input transistors M21 and M22 may also be used to provide common-mode feedback control for the first stage 24. The input differential signal applied to the gates of transistors M21 and M22 is equal to the output signal swing of second stage 26 divided by the voltage gain of second stage 26. The voltage gain of second stage 26 is large, and consequently the input differential signal swing should be small. With a small input signal swing, transistors M21 an M22 will process small signals and therefore will operate as relatively linear transconductance elements. For this reason, common source node 96 will remain relatively independent of the differential portion of the input signal. This common-source node 96 will vary in direct proportion to the common-mode portion of the input signal. Consequently, common source node 96 may be used to provide a common-mode control signal to control the output common-mode of first stage 24, and the resulting common-mode control signal will remain substantially independent of the differential component of the signal at the output of first stage 24. Therefore, the common-mode and differential circuitry remain substantially independent of one another, thus avoiding settling problems caused by interactions of the common-mode and differential circuitry.

Differential PMOS current mirror section 78 includes p-channel current mirrors (M27 and M25) and (M23 and M37), which are connected to drains of transistors M21 and M22, respectively. Similarly, differential NMOS current mirror section 86 includes n-channel current mirrors (M29 and M33) and (M28 and M34), which are connected to the drain nodes of transistors M26 and M30, respectively. PMOS current mirror section 78 has mirror input node 132 (between the gates of transistors M25 and M27) and mirror input node 134 (between the gates of transistors M23 and M37). Also, NMOS current mirror section has mirror input node 136 (between the gates of transistors M33 and M29) and mirror input node 138 (between the gates of transistors M28 and M34).

Switch section 94 includes switches SW1 and SW2. Switch SW1 is connected between mirror input nodes 132 and 134 and switch SW2 is connected between mirror input nodes 136 and 138. These switches are closed during phase 1 (sample configuration) to assist in disabling the differential operation of second-stage 26.

PMOS cascode section 90 includes cascode transistors M31 and M35, which have their source nodes connected to drain nodes of transistors M25 and M37, respectively, of the PMOS current mirror section 78. Similarly, NMOS cascode section 92 includes cascode transistors M32 and M36, which have their source nodes connected to the drain nodes of transistors M33 and M34, respectively, of NMOS current mirror section 86. Cascode transistors M31 and M35 are biased at their gates by a bias voltage applied at bias node VBIASP. Cascode transistors M32 and M36 are biased at their gates by a bias voltage applied at a bias node VBIASN. The drain nodes of cascode transistors M32 and M31 are connected together at output node OUTT2. Likewise, the drain nodes of cascode transistors M35 and M36 are connected together at output node OUTC2.

Common-mode feedback control section 88 receives an input signal on common-mode control node CMCTRL2, which input signal is proportional to the difference between a measured common-mode voltage of output nodes OUTC2 and OUTT2 and a preselected common-mode voltage. Also, common-mode feedback control section 88 is connected to mirror input nodes 136 and 138 so as to drive common-mode control currents ICM1 and ICM2 into (and out of) nodes 136 and 138, respectively.

The common-mode control of second stage 26 is a challenging problem. Common-mode settling of second stage 26 typically degrades the differential settling response of two-stage amplifier 30. This is avoided in embodiment 76 by implementing a large transconductance in common-mode feedback control section 88 to provide fast common-mode settling response, and by applying common-mode control currents, ICM1 and ICM2, to differential NMOS current mirror section 86. The problem typically encountered with common-mode control is that the common-mode and differential settling responses of the amplifier influence one another, thus causing the combined settling of both the common-mode and the differential response to take a longer amount of time than that of the individual settling responses. The configuration of the common-mode feedback control in embodiment 76, in which control currents ICM1 and ICM2 are applied to NMOS current mirror section 86, minimizes the interaction between the common-mode and differential settling responses.

Figure 10:
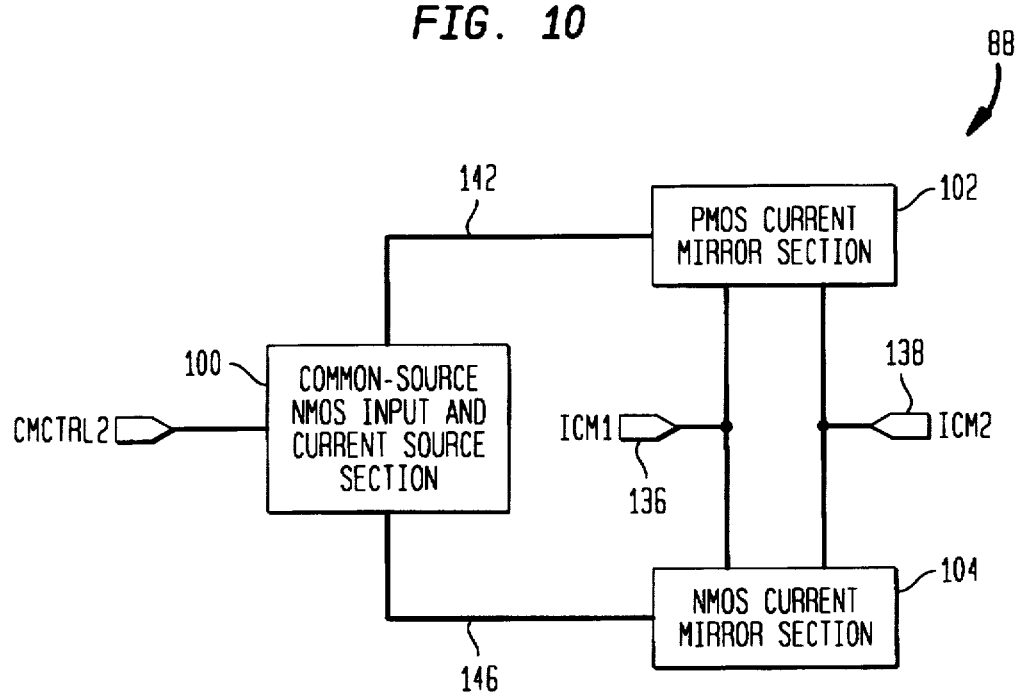
FIG. 10 is a block diagram showing an embodiment of the common-mode feedback control section of the amplifier.

Referring next to FIG. 10, as well as FIG. 9, a block diagram of common-mode feedback control section 88 is depicted. Common-mode control node CMCTRL2 is connected to common-source NMOS input and current source section 100. Outputs from common-source NMOS input and current source section 100 are connected to PMOS current mirror section 102 and NMOS current mirror section 104. PMOS current mirror section 102 has two outputs, connected to nodes 136 and 138 respectively. NMOS current mirror section 104 has two outputs connected to nodes 136 and 138 respectively. The outputs of PMOS current mirror section 102 and NMOS current mirror section 104 collectively produce currents ICM1 and ICM2. In the configuration of the common-mode feedback control section 88, the common-mode transconductance is increased through the use of current mirror gain in PMOS current mirror section 102 and in NMOS current mirror section 104. The resulting large transconductance facilitates a fast common-mode settling response.

Figure 11:
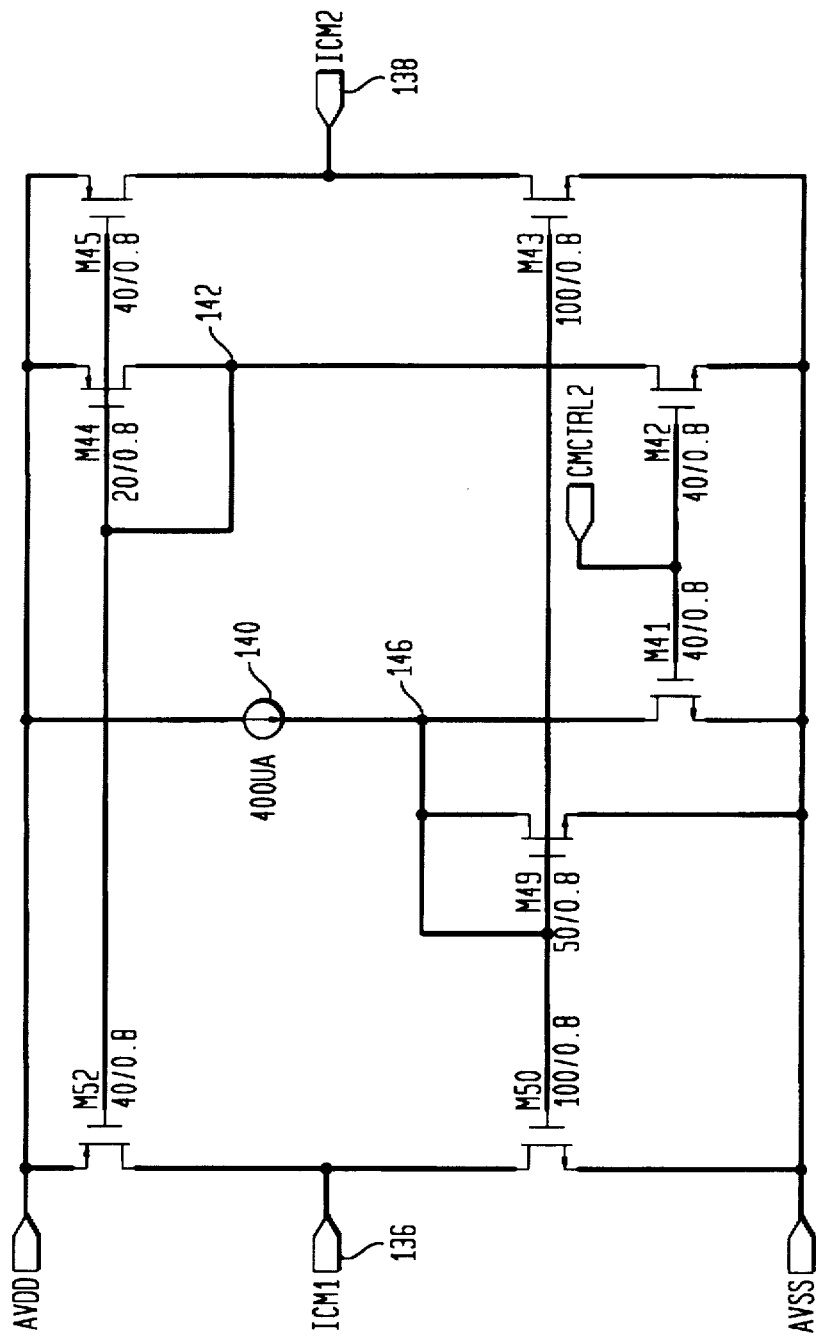
FIG. 11 is a schematic of the embodiment of the common-mode feedback control section of the amplifier shown in FIG. 10.

Now referring to FIG. 11, as well as FIGS. 9 and 10, a detailed circuit diagram of common-mode feedback control section 88 is shown. Common source NMOS input and current source section 100 comprises current source 140 and common source N-channel transistors M41 and M42. Common-mode control node CMCTRL2 is connected to the gates of both of transistors M41 and M42. The drains of transistors M41 and M42 are connected to output nodes 146 and 142, respectively.

PMOS current mirror section 102 includes p-channel transistors M44, M52 and M45. Similarly, NMOS current mirror section 104 includes n-channel transistors M49, M50 and M43. Each of the outputs of the p-channel mirrors (i.e., the drains of transistors M52 and M45) are connected to one each of the outputs of the n-channel mirrors (i.e., the drains of transistors M50 and M43) at mirror input nodes 136 and 138 of embodiment 76 of the second stage 26. As a result, currents ICM1 and ICM2 flow into (and out of) mirror input nodes 136 and 138, respectively.

Figure 12:
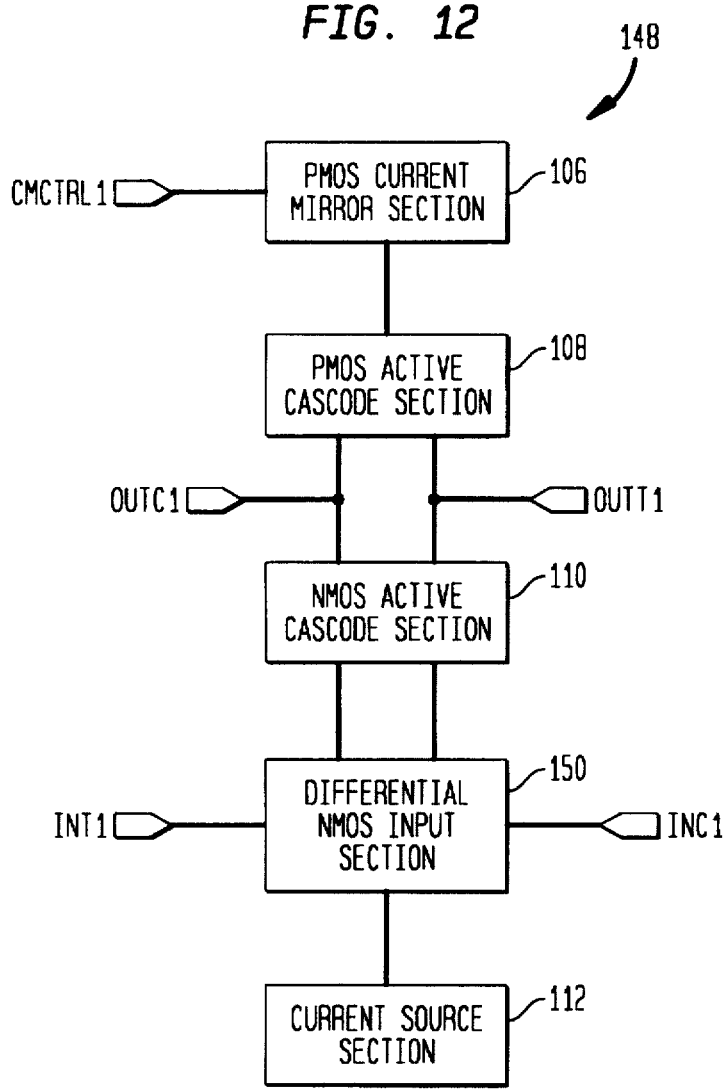
FIG. 12 is a block diagram of another embodiment of the first amplifier.

A block diagram of a second embodiment 148 of the first stage 24 of the two-stage amplifier 30 is shown in FIG. 12. Opposite polarity input nodes INT1 and INC1 are present across the input of a differential NMOS input section 150. Differential NMOS input section 150 is driven by a current source section 112. Differential outputs of the differential NMOS input section 150 are connected to a NMOS active cascode section 110. The differential outputs of the NMOS active cascode section 110 are connected to a PMOS active cascode section 108 at a pair of output nodes OUTC1 and OUTT1. Additionally, a PMOS current mirror section 106 is connected to the PMOS active cascode section 108. The PMOS current mirror section 106 is controlled, at least in part, by a common-mode control signal present at common-mode control node CM1. This common-mode control signal comes from the second stage 26 of the two-stage amplifier 30.

Figure 13:
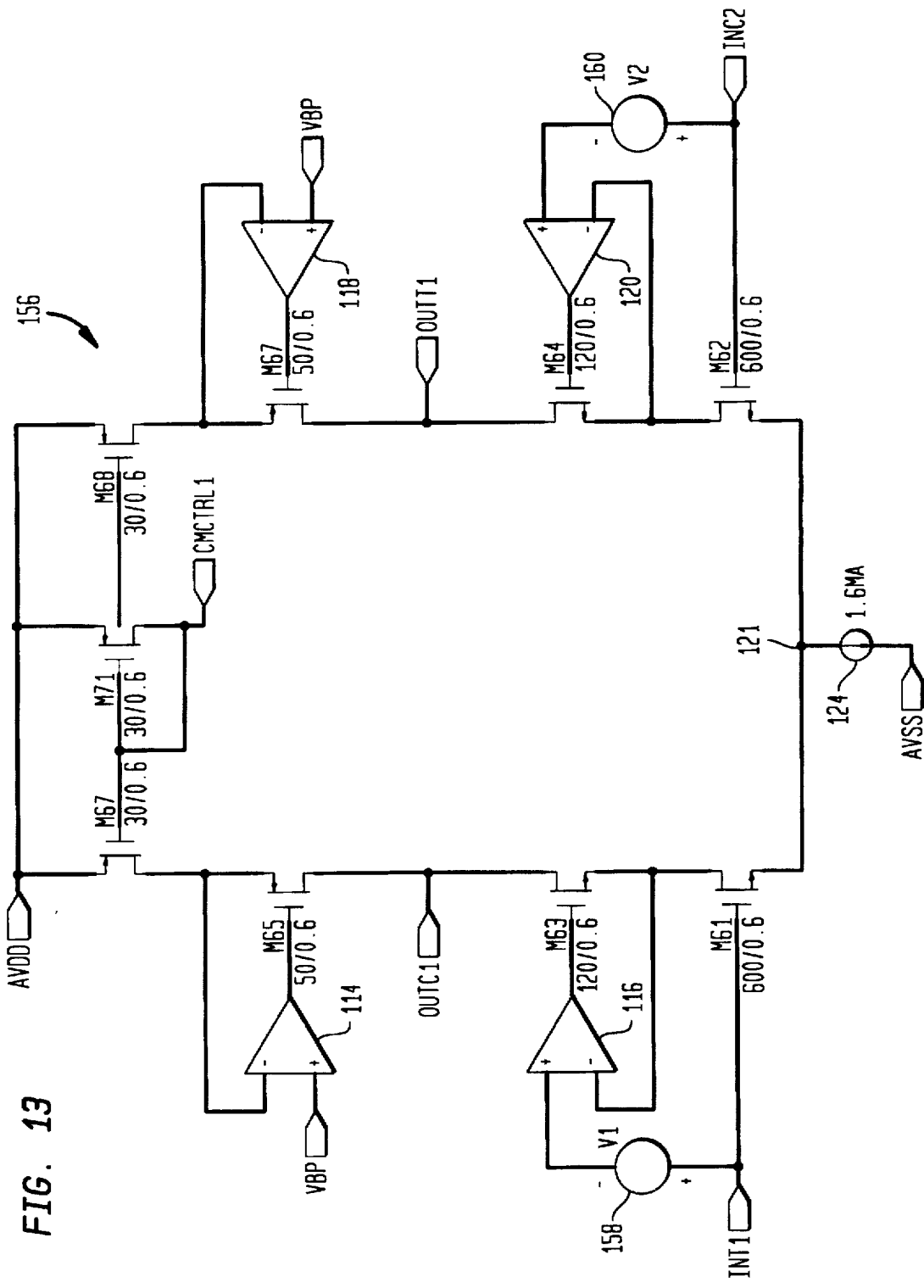
FIG. 13 is a schematic of one implementation of the embodiment of the first amplifier shown in FIG. 12.

Referring now to FIG. 13, in addition to FIG. 12, a detailed circuit diagram of one implementation 156 of embodiment 148 is depicted. Differential NMOS input section 150 includes a differential pair of commonly doped (n-channel) input transistors M61 and M62. Input transistors M61 and M62 share a common source node 121 connected to (1.6 mA) current source 124, and have their gates connected to opposite polarity input nodes INT1 and INC1, respectively. PMOS active cascode section 110 includes (n-channel) cascode transistors (M63 and M64), amplifiers (116 and 120) and voltage biasing circuits (158 and 160). The source nodes of cascode transistors M63 and M64 are connected to the drains of differential input transistors M61 and M62, respectively. The output and the negative input of amplifier 116 are connected to the gate and source of cascode transistor M63, respectively. Similarly, the output and the negative input of amplifier 120 are connected to the gate and source of cascode transistor M64, respectively. This active cascode structure causes a substantial increase in the output impedance of the first stage. Voltage biasing circuits 158 and 160 are connected between opposite polarity input nodes INT1 and INC1 and the positive inputs of amplifiers 116 and 120, respectively, so as to bias the amplifiers with respect to a voltage present at these nodes.

PMOS active cascode section 108 includes cascode transistors M65 and M66, as well as amplifiers 114 and 118. The drain nodes of cascode transistor M65 and M66 are connected (via output nodes OUTC1 and OUTT1) to the drain nodes of cascode transistors M63 and M64, respectively. Amplifier 114 has an output and a negative input connected to the gate and source of cascode transistor M65, respectively. Similarly, amplifier 118 has an output and a negative input connected to the gate and source of cascode transistor M66, respectively. The positive inputs of amplifiers 114 and 118 are both biased by a voltage present at biasing nodes VBP.

The use of amplifiers 114, 118, 116, and 120 to increase the output impedance of active cascode sections 108 and 110 results in an increase in the dc gain of first stage 24 of two stage amplifier 30. The gain of first stage 24 is increased by a factor determined by the dc gains of the four amplifiers 114, 118, 116, and 120. For example, if all four of these amplifiers have the same dc gain, then the dc gain of first stage 24 will increase by a factor equal to the dc gain of the four amplifiers.

A large dc gain of amplifier 24, made possible through the use of active cascode sections 108 and 110 with amplifiers 114, 118, 116 and 120, may be used to make up for a small dc gain of second stage amplifier 26 of two stage amplifier 30. This can greatly reduces the difficulty of implementation of second stage amplifier 26. This is so because second stage amplifier 26 must simultaneously have large voltage swing at its output and also have very wide bandwidth (in excess of the closed-loop bandwidth of two stage amplifier 30). These voltage swing and bandwidth requirements of amplifier 26 are difficult to meet simultaneously, and are much easier to meet if amplifier 26 is not required to have high dc gain. First stage 24, on the other hand, is not required to have high voltage swing at its output, and is not required to have as large a bandwidth as that of second stage 26. Consequently, it is much easier to implement a high dc gain in first stage 24.

PMOS Current mirror section 106 includes p-channel mirror transistors M67, M68 and M71. The source nodes of all three mirror transistors are connected to high voltage supply node AVDD. The drain nodes of mirror transistors M67 and M68 are connected to the source nodes of cascode transistors M65 and M66, respectively. The gates of all three mirror transistors are connected together as well, and common-mode control node CM1 is connected to the drain of mirror transistor M71, which is also connected to the gates of the three mirror transistors. In this manner, the current present at common-mode control node CM1 controls the current through mirror transistors M67 and M68, thus effectively controlling the common-mode level of the first stage.

The common-mode control signal applied to common-mode control node CMCTRL1 may be provided using input circuitry in second stage 26. Specifically, a common-source node of a differential pair in the input of second stage 26 may be used in conjunction with a transconductance device to generate a common-mode control current which is fed back to node CMCTRL1 of implementations 156 (FIG. 13), 152 (FIG. 14), or 154 (FIG. 15) of embodiment 148 (FIG. 12) of first stage 24. This common-mode feedback senses the common-mode of first stage 24 using input devices in second stage 26, and provides an error current signal that is applied to common-mode control node CMCTRL1. This error current signal is proportional to the difference between a predetermined common-mode level and the actual common-mode level at the output of first stage 24. The resulting common-mode control loop is substantially independent of differential signals at the output of first stage 24, and has the advantage over switched-capacitor common-mode feedback circuits in that it does not add parasitic capacitance ($C_P$), between stage 24 and stage 26.

Figure 14:
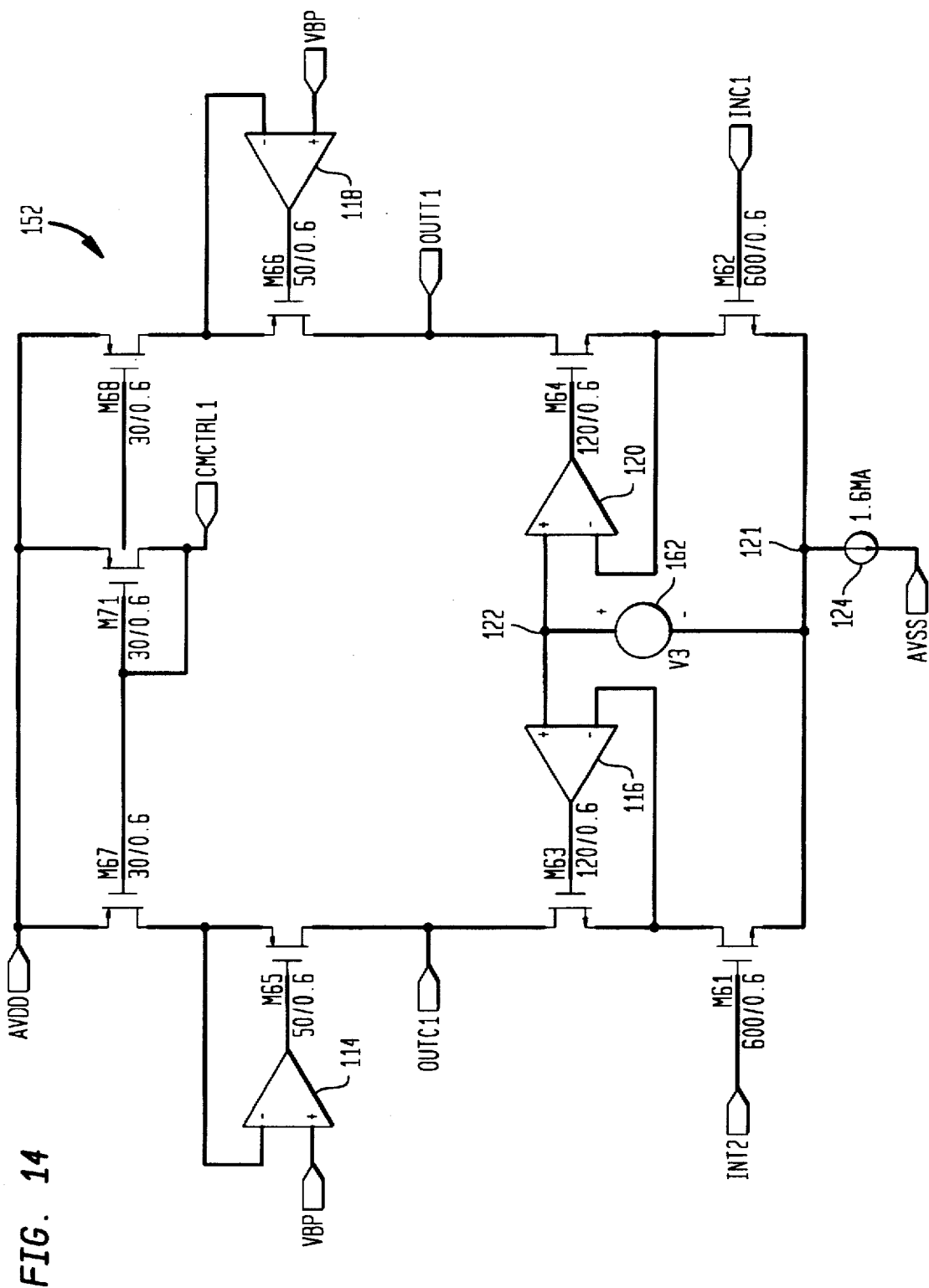
FIG. 14 is a schematic of another implementation of the embodiment of the first amplifier shown in FIG. 12.
Figure 15:
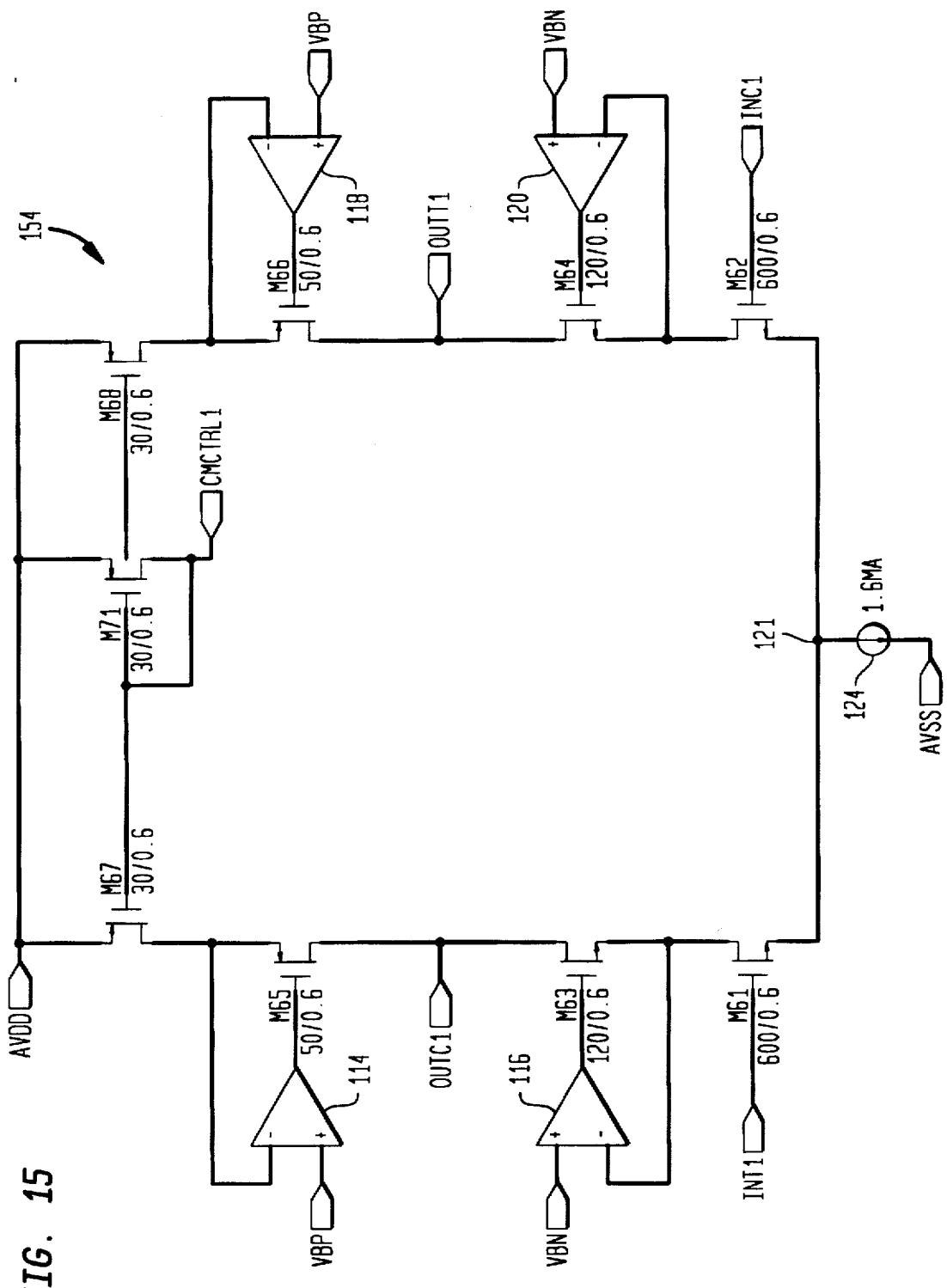
FIG. 15 is a schematic of yet another implementation of the embodiment of the first amplifier shown in FIG. 12.

Next referring to FIGS. 14 and 15, in addition to FIGS. 12 and 13, implementations 152 and 154 of embodiment 148 of the first stage 24 are shown. Implementations 152 and 154 differ from implementation 156 only in the manner in which the positive inputs of amplifiers 116 and 120 receive bias voltages. In embodiment 152, the positive inputs of amplifiers 116 and 120 are connected at circuit node 122, which is biased by voltage biasing circuit 162 connected between common source node 121 and circuit node 122. In embodiment 154, amplifiers 116 and 120 both have their positive inputs biased by a voltage present at biasing node VBN.

Embodiment 148 of the first stage 24 depicted in FIG. 12 differs significantly from embodiment 56 depicted in FIG. 5. Embodiment 148 does not use a complementary structure and consequently, for an equivalent power consumption, provides less current slew capability. However, strong slew capability in the first stage is only required during the sampling phase of operation (phase 1), when the first stage is required to slew input capacitor array 34. The disadvantage of the reduced slew capability of embodiment 148 may be mitigated, for example, if the total capacitance of input capacitor array 34 is reduced, thus reducing the need for large slew requirement in first stage 24.

There are a number of advantages of embodiment 148. This embodiment can be made operational with lower supply rails than embodiment 56, because a smaller voltage drop is required between the positive supply rail, AVDD, and the outputs of the stage, OUTT1 and OUTC1, to ensure proper biasing of the PMOS devices. Another significant advantage of embodiment 148, is that smaller cascode transistor sizes may be used in order to decrease the parasitic, $C_P$, at the output of the first stage. This decrease in the value of $C_P$, makes possible the use of a smaller Miller capacitor, $C_c$, around the second stage 26 of two stage amplifier structure 30 without causing a corresponding decrease in the bandwidth of second stage 26 resulting from a decrease in the feedback gain, $Beta_2$, around the second stage. The use of a smaller value of $C_c$ results in a larger gain-bandwidth of two-stage amplifier 30.

Another advantage of embodiment 148 is that it utilizes a differential NMOS input section. NMOS devices typically provide higher transconductance than similarly sized PMOS devices. Consequently, NMOS devices provide less parasitic input capacitance than that of corresponding PMOS devices sized to provide the same transconductance. For this reason, for the same transconductance embodiment 148 of first stage 24 can provide less parasitic input capacitance than that of embodiment 56. Reduced parasitic input capacitance in first stage 24 is desirable because this parasitic input capacitance decreases the feedback gain factor, Beta, of two stage amplifier 30 and consequently decreases its closed-loop bandwidth.

Referring now to FIG. 16, a block diagram of embodiment 126 of the second stage 26 of amplifier 30 is depicted. Opposite polarity input nodes INC2 and INT2 are connected to differential NMOS and PMOS input sections 80 and 84 so as to receive an output signal from the first-stage amplifier 24. This is accomplished by connecting input nodes INC2 and INT2 to output nodes OUTC1 and OUTT1, respectively, from embodiment 56 of the first stage 24 (shown in FIG. 5) or from embodiment 148 (shown in FIG. 12). Referring still to FIG. 16, each of these differential input sections 80 and 84 is connected to current source section 82. The output of NMOS input section 80 is connected to differential PMOS positive feedback current mirror section 164 and the output of PMOS input section 84 is connected to differential NMOS positive feedback current mirror section 166. Switch section 94 is connected to mirror sections 164 and 166. The outputs of current mirror sections 164 and 166 are connected at output nodes OUTT2 and OUTC2.

Figure 17:
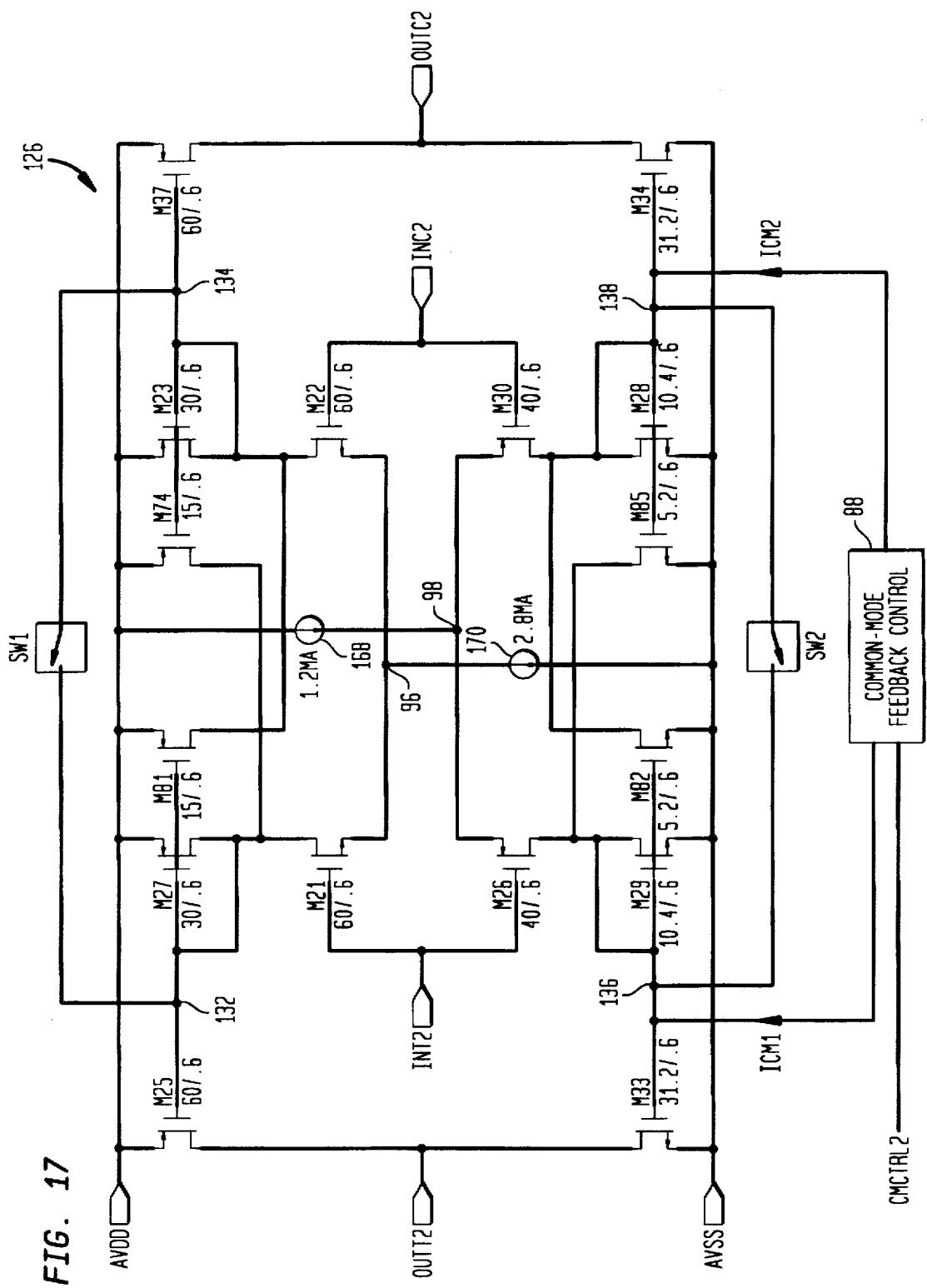
FIG. 17 is a schematic of the embodiment of the second amplifier shown in FIG. 16.

Now referring to FIG. 17, in addition to FIG. 16, a detailed schematic of embodiment 126 of second stage 26 is shown. Differential NMOS input section 80 includes a differential pair of commonly doped (n-channel) input transistors M21 and M22 source connected at a common node 96 and driven by (2.8 mA) current source 170. Differential PMOS input section 84 includes a differential pair of commonly doped (p-channel) input transistors M26 and M30 source connected at a common node 98 and driven by (1.2 mA) current source 168. Current sources 168 and 170 comprise current source section 82. Together, transistors M21 and M26 comprise a complementary pair of oppositely doped input transistors having a common input node INT2. Similarly, transistors M22 and M30 comprise a complementary pair of oppositely doped input transistors having a common input node INC2. Opposite polarity input nodes INT2 and INC2 are connected to receive an output signal from the output of the first amplifier 24.

Differential PMOS positive feedback current mirror section 164 includes p-channel current mirrors (M27 and M25) and (M23 and M37), which are connected to drains of transistors M21 and M22, respectively, as well as cross-coupled positive feedback (p-channel) transistors M81 and M74. The gates of transistors M81 and M74 are tied to the gates of transistors M27 and M23, respectively, and the drains of transistors M81 and M74 are tied to the drains of transistors M23 and M27, respectively. Similarly, differential NMOS positive feedback current mirror section 166 includes n-channel current mirrors (M29 and M33) and (M28 and M34), which are connected to the drain nodes of transistors M26 and M30, respectively, as well as cross-coupled positive feedback (n-channel) transistors M82 and M85. The gates of transistors M82 and M85 are tied to the gates of transistors M29 and M28, respectively, and the drains of transistors M82 and M85 are tied to the drains of transistors M28 and M29, respectively. Differential PMOS positive feedback current mirror section 164 has mirror input node 132 (between the gates of transistors M25 and M27) and mirror input node 134 (between the gates of transistors M23 and M37). Also, differential NMOS positive feedback current mirror section 166 has mirror input node 136 (between the gates of transistors M33 and M29) and mirror input node 138 (between the gates of transistors M28 and M34).

Embodiment 126 of second stage 26 has two important differences from embodiment 76 of second stage 26. Firstly, embodiment 126 does not have cascode devices in its output stage. This will result in reduced dc gain relative to that of embodiment 76. However, this also reduces the difficulty of simultaneously achieving both high voltage swing at the output of second stage 26 and wide bandwidth in second stage 26. For the same output voltage swing in second stage 26, increased voltage drops may be maintained across differential PMOS positive feedback current mirror section 164 and across differential NMOS positive feedback current mirror section 166 in embodiment 126 relative to the voltage drop that can be maintained across differential PMOS current mirror section 78 and differential NMOS current mirror section 86 in embodiment 76. The increased voltage drop in embodiment 126 makes possible the use of much smaller device sizes in current mirror sections 164 and 166. This, in turn, results in reduced parasitic capacitances in the current mirrors, and much wider bandwidth operation of the current mirrors. The reduced parasitic capacitance also makes possible the use of large current mirror gains while maintaining stable operation of second stage 26. The large current mirror gains result in increased transconductance and increased bandwidth of second stage 26. Thus, the implementation of embodiment 126 without cascode transistors makes possible both large voltage swing and wide bandwidth in second stage 26.

The second difference between embodiments 126 and 76 of second stage 26 is that, in embodiment 76, positive feedback is used in the current mirror sections at the output of the amplifier. This positive feedback is implemented using cross-coupled positive feedback (p-channel) transistors M81 and M74 and cross-coupled positive feedback (n-channel) transistors M82 and M85. These transistors effectively increase the small-signal current gain of the current mirror sections, thus increasing the transconductance and bandwidth of second stage 26. The advantage of this positive feedback technique is that it effectively increases the current gain without increasing quiescent current and power consumption of second stage 26.

A high current gain of the current mirrors in embodiment 126 (i.e. current gain in differential PMOS positive feedback current mirror section 164 and in differential NMOS positive feedback current mirror section 166) also makes possible the use of reduced device sizes in differential NMOS input section 80 and in differential PMOS input section 84. Because of the large current mirror gain, it is possible to obtain large overall transconductance in second stage 26 without requiring large transconductance in the input section of second stage 26. Consequently smaller device sizes with a corresponding decrease in input parasitic capacitance, $C_P$, can be utilized. This decrease in the value of $C_P$, makes possible the use of a smaller Miller capacitor, $C_c$, around the second stage 26 of two stage amplifier structure 30 without causing a corresponding decrease in the bandwidth of second stage 26 resulting from a decrease in the feedback gain, Beta$_2$, around the second stage. The use of a smaller value of $C_c$ results in a larger gain-bandwidth of two-stage amplifier 30.

Switch section 94 includes switches SW1 and SW2. Switch SW1 is connected between mirror input nodes 132 and 134 and switch SW2 is connected between mirror input nodes 136 and 138. These switches are closed during phase 1 (sample configuration) to assist in disabling the differential operation of second stage 26.

The common-mode feedback control signal for first stage 24 may be implemented using input circuitry in second stage 26. Specifically, referring to FIGS. 18(a) and 18(b), in addition to FIG. 17, detailed circuit diagrams are shown of two implementations 300 and 301 of a common-mode control circuit for providing common-mode control of first stage 24. The control circuits 300 and 301 in FIGS. 18 (a) and 18(b) operate in conjunction with implementations 156 (FIG. 13) 152 (FIG. 14) or 154 (FIG. 15) of embodiment 148 of first stage 24 and an input differential pair in second stage 26.

Figure 18A:
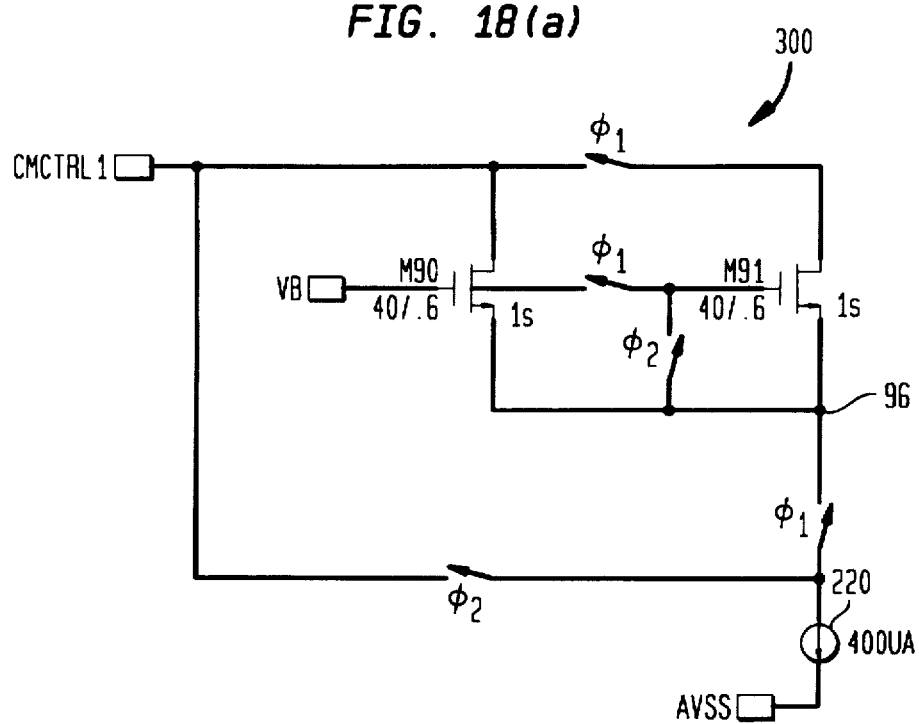
FIG. 18(a) is a schematic of one implementation of a common-mode control circuit for controlling the common-mode of the first amplifier.

FIG. 18(a) illustrates a first implementation 300 of a common-mode feedback circuit to be used to control the common-mode of first stage 24. Transistor M90 in FIG. 18(a) operates as a transconductance device with a bias voltage applied at bias node VB connected to its gate. The source of transistor M90 is connected to node 96, which is also the common source node of the differential pair of commonly doped (n-channel) input transistor M21 and M22 in FIG. 17. The drain node of transistor M90 is connected to common-mode control node CMCTRL1. As the common-mode of the output of first stage 24 increases, the voltage at common source node 96 at the sources of transistors M21 and M22 also increases. This decreases the current in transistor M90. This decreasing current is fed to common-mode control node CMCTRL1 and causes a decrease in the common-mode of the output signal at the output of first stage 24. Current source 220 and transistor M91 are switched between the two phases of operation. During phase 1, transistor M91 is switched in parallel with transistor M90 and current source 220 is switched to node 96 to increase the current flowing in transistors M90 and M91. This increases the transconductance of the common-mode feedback during phase 1 and thus increases the bandwidth of the common-mode control loop that adjusts the common-mode level of stage 24. During phase 2, the gate and source nodes of transistor M91 are shorted together and current source 220 is switched directly to node CMCTRL1. This decreases the transconductance of the common-mode feedback and decreases the bandwidth of the common-mode control loop. This is important because the capacitative loading at the output of the first stage decreases during phase 2 when the Miller capacitor 32 is the only capacitance connected to the output of stage 24. During phase 1, on the other hand, the capacitance at the output of stage 24 also includes the input array capacitance ($C_{ARRAY}$). Therefore, if the common-mode loop has low bandwidth during phase 1 and has too much bandwidth during phase 2, it could potentially become unstable. The switching of current source 220 between the two phases of operation also ensures that the current density in transistor M90 remains constant and therefore the gate-source voltage does not change. A changing gate-source voltage would be undesirable because it would cause a change in the common-mode level at the output of the first stage 24 between the two phases of operation.

Figure 18B:
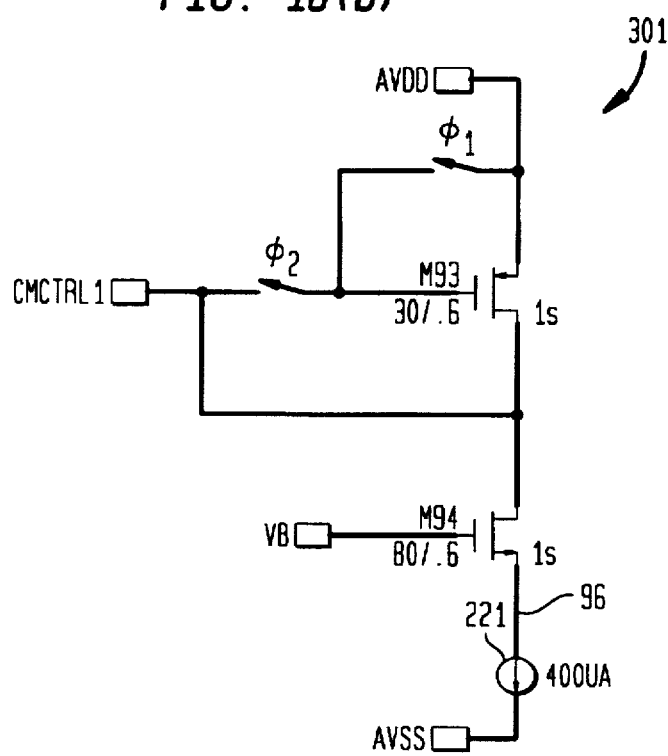
FIG. 18(b) is a schematic of another implementation of a common-mode control circuit for controlling the common-mode of the first amplifier.
Figure 19:
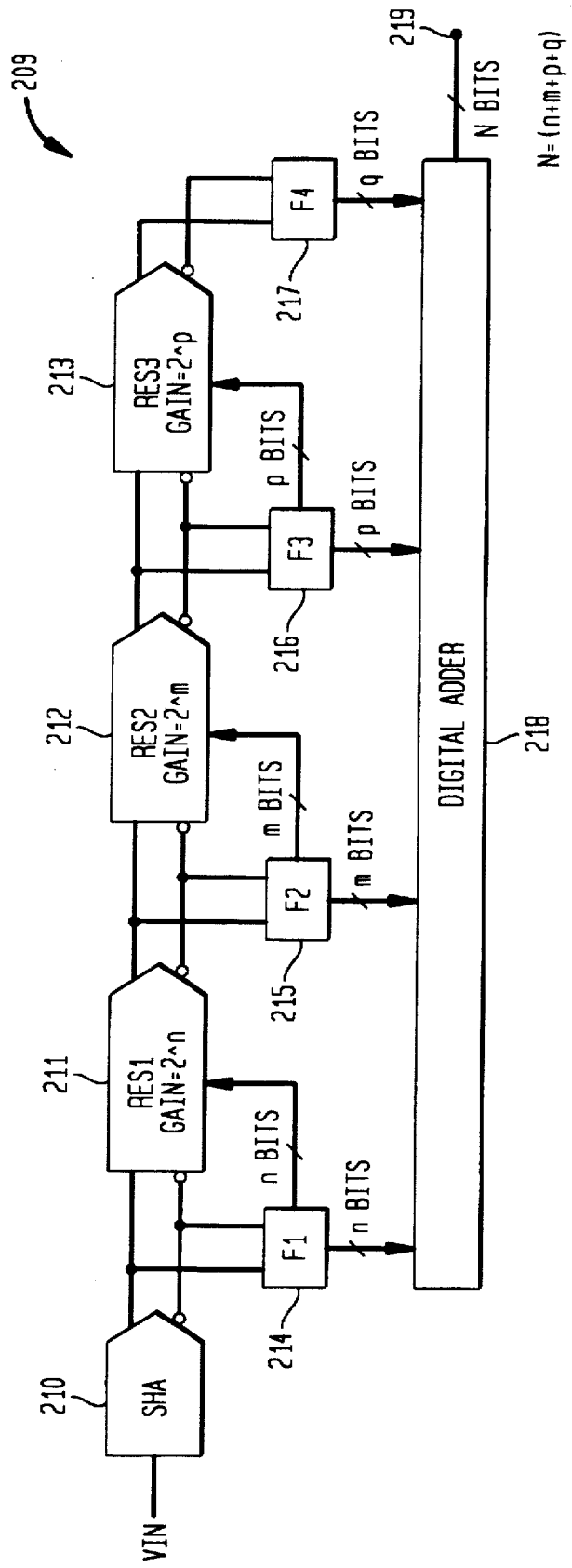
FIG. 19 is a block diagram of a typical pipelined ADC converter.

FIG. 18(b) illustrates a second implementation 301 of a common-mode feedback circuit to be used to control the common-mode of first stage 24. Transistor M94 in FIG. 18(b) operates as a transconductance device with a bias voltage applied at bias node VB connected to its gate. The drain of transistor M94 is connected to node 96, which is also the common source node of the differential pair of commonly doped (n-channel) input transistors M21 and M22 in FIG. 17. The drain node of transistor M94 is also connected to common-mode control node CMTRL1. This circuit operates in the same manner as embodiment 300 in FIG. 18(a). The primary difference between these two circuits is the manner in which the common-mode bandwidth is adjusted between the two phases of operation. In implementation 301, the transconductance of the common-mode feedback device M94 remains constant, but the current gain is adjusted as it is fed into first stage 24. Transistor M93 is switched in parallel with transistor M71 (shown in implementations 156 (FIG. 13), 152 (FIG. 14), and 154 (FIG. 15) of embodiment 148 (FIG. 12) of first stage 24) during phase 2. This effectively decreases the current gain of the common-mode feedback during phase 2 and thus decreases the common-mode bandwidth.

From the forgoing detailed description, one skilled in the art will realize that various combinations of the different embodiments of each stage of the two-stage amplifier circuit disclosed herein are possible. Two such combinations that have shown to be particularly useful in overcoming the limitations of prior art residue amplifiers are (1) embodiment 56 of the first-stage 24 and embodiment 76 of the second-stage 26, and (2) embodiment 148 of the first-stage 24 and embodiment 126 of the second-stage 26. Both of these combinations result in two-stage amplifier circuits that have high dc gain, are very fast, have a large (input and output) slew capability, operate off limited voltage supply rails and consume an appreciably low amount of power.

More specifically, both of these two-stage amplifier circuits have an open-loop dc gain of at least 90 dB, and a closed-loop gain of sixteen. The first combination (i.e., embodiment 56 of the first-stage 24 and embodiment 76 of the second-stage 26) has a unity-gain bandwidth of at least 400 MHz during amplify configuration, a closed-loop bandwidth of at least 25 MHz during both input sample configuration and amplify configuration, an input current slew capability of at least ±4mA, an output current slew capability of at least ±6mA, and a power consumption of less than 65 mW on a five volt supply. Similarly, the second combination (i.e., embodiment 148 of the first-stage 24 and embodiment 126 of the second-stage 26) has a unity-gain bandwidth of at least 800 MHZ during amplify configuration, a closed-loop bandwidth of at least 50 Mhz during both input sample configuration and amplify configuration, an input current slew capability of at least ±1.6 mA, an output current slew capability of at least ±9 mA, and a power consumption of less that 80 mW on a five volt supply. Thus, the present invention will allow the (high speed/low power) conversion of multiple bits in the first stage of a multi-stage pipe-lined ADC. As a result, high accuracy conversions will take place without burdensome device calibration and without unreasonable power consumption.

While the particular illustrative embodiment shown and described above will be useful in many applications, further modifications to the present invention herein disclosed will occur to persons skilled in the art. All such modifications are deemed to be within the scope and spirit of the present invention defined by the appended claims and equivalents thereof.

What is claimed is:

1. A switched capacitor circuit, comprising:
   a first amplifier having
      a first input, and
      a first output;
   a second amplifier having
      a second input coupled to said first output to receive a first output signal from said first output,
      an input circuit coupled to said second input,
      a current gain stage, coupled to an output of said input circuit, arranged to provide a greater-than-unity current-gain between an input and an output of the current-gain stage, and
      a second output coupled to the output of the current-gain stage;
   at least one switch arranged to sample an input signal of the switched capacitor circuit onto at least one input capacitor; and a feedback capacitor coupled between said second output and said first input during at least one time interval.

2. A switched capacitor circuit as claimed in claim 1, wherein said second amplifier comprises a complementary pair of oppositely doped input transistors having a common input node coupled to said second input.

3. A switched capacitor circuit as claimed in claim 2, wherein at least one of said complementary pair of oppositely doped input transistors is included in a differential pair of commonly doped input transistors coupled to a common current electrode.

4. A switched capacitor circuit as claimed in claim 1, wherein a total input capacitance of said at least one input capacitor is at least four times a total feedback capacitance of said feedback capacitor.

5. A switched capacitor circuit as claimed in claim 1, wherein said second amplifier has a voltage gain and further comprises a cascode transistor coupled to an output of said current gain stage, thereby increasing said voltage gain of said second amplifier.

6. A switched capacitor circuit as claimed in claim 1, wherein said input circuit of said second amplifier comprises a differential pair of commonly doped input transistors coupled to a common current electrode.

7. A switched capacitor circuit as claimed in claim 6, wherein:
   said second amplifier further comprises a common-mode control circuit having circuitry for producing a common-mode control current representative of a difference between a common-mode level of an output of said second amplifier and a preselected common-mode level,
   said current-gain stage includes a pair of current mirrors coupled, respectively, to outputs the differential pair of input transistors, and
   said common-mode control circuit is coupled to input nodes of said current mirrors so that said common-mode control current is injected into said input nodes of said current mirrors.

8. A switched capacitor circuit as claimed in claim 6, wherein:
   said current-gain stage includes a pair of current mirrors coupled, respectively, to outputs the differential pair of input transistors, and
   said second amplifier further comprises a shorting switch coupled to at least one of a pair of input nodes of said current mirrors to selectively at least partially disable at least one of the pair of current mirrors to assist in disabling said second amplifier.

9. A switched capacitor circuit as claimed in claim 6, wherein said second amplifier further comprises a shorting switch coupled to said second output to selectively at least partially disable said second amplifier.

10. A switched capacitor circuit as claimed in claim 6, wherein said current-gain stage includes a pair of current mirrors coupled, respectively, to a pair of outputs of said differential pair and said current mirrors are connected so as to have positive feedback, thereby increasing a small signal current gain of said pair of current mirrors without a corresponding increase in power consumption of said amplifier circuit.

11. An amplifier circuit as claimed in claim 1, wherein said first amplifier comprises a complementary pair of oppositely doped input transistors having a common input node coupled to said first input.

12. A switched capacitor circuit as claimed in claim 11, wherein said first amplifier has a voltage gain and further comprises at least one cascode transistor coupled to an output of said complementary pair of oppositely doped input transistors, thereby increasing said voltage gain.

13. A switched capacitor circuit as claimed in claim 1, wherein said first amplifier has a voltage gain and comprises a cascode transistor coupled to an output of an input circuit of said first amplifier thereby increasing said voltage gain.

14. A switched capacitor circuit as claimed in claim 13, wherein said first amplifier further includes a third amplifier coupled to said cascode transistor so as to increase the voltage gain of the first amplifier beyond that provided by the cascode transistor.

15. An amplifier circuit as claimed in claim 14, wherein said third amplifier has a biasing input coupled to said first input of said first amplifier so that said biasing input is biased with respect to a signal at said first input.

16. An amplifier circuit as claimed in claim 14, wherein said third amplifier has a biasing input coupled to a common current electrode of a differential pair of commonly doped input transistors within said first amplifier so that said biasing input is biased with respect to a signal at said common current electrode.

17. A switched capacitor circuit, comprising:
   an amplifier including:
      first and second oppositely doped input transistors, each of the input transistors having first and second current electrodes and a control electrode, the control electrodes of the input transistors being coupled to an input node of the amplifier;
      a first current source coupled to the first current electrode of the first input transistor;
      a first cascode transistor, of a common doping type as the first input transistor, coupled between the second current electrode of the first input transistor and an output node of the amplifier;

a second current source coupled to the first current electrode of the second input transistor;

a second cascode transistor, of a common doping type as the second input transistor, coupled between the second current electrode of the second input transistor and the output node of the amplifier; and at least one switch arranged to sample an input signal of the switched capacitor circuit onto at least one input capacitor.

18. A switched capacitor circuit as claimed in claim 17, wherein each of the pair of input transistors is included in a different differential pair of commonly doped input transistors that is biased by a respective one of the first and second current sources.

19. A switched capacitor circuit as claimed in claim 18, wherein a control electrode of each of the cascode transistors is arranged to be biased with respect to a voltage at a common current electrode of one of the differential pairs of input transistors.

20. A switched capacitor circuit as claimed in claim 17, wherein:

the amplifier constitutes a first amplifier in a multi-stage amplifier;

an output of the first amplifier is coupled to an input of a second amplifier included in the multi-stage amplifier; and a feedback capacitor is coupled between an output of said second amplifier and an input of the first amplifier during at least one time interval.

21. A switched capacitor circuit, comprising:

a primary amplifier including:
at least one input node,
an input circuit coupled to said at least one input node,
a cascode transistor coupled to an output of said input circuit to increase a voltage gain of the primary amplifier,
a secondary amplifier coupled to said cascode transistor so as to increase the voltage gain of said primary amplifier beyond that provided by the cascode transistor, wherein said secondary amplifier has a biasing input coupled to the input of the primary amplifier so that said biasing input is biased with respect to a signal at the input of the primary amplifier, and
an output node; and at least one switch arranged to sample an input signal of the switched capacitor circuit onto at least one input capacitor.

22. A switched capacitor circuit as claimed in claim 21, wherein the primary amplifier constitutes a first amplifier in a multi-stage amplifier.

23. A switched capacitor circuit as claimed in claim 21, wherein:

said input circuit includes a differential pair of commonly doped input transistors coupled to a common current electrode, said at least one input node includes a pair of input nodes, and each of the pair of inputs nodes is coupled to a control electrode of a respective one of said differential pair of input transistors.

24. A switched capacitor circuit as claimed in claim 22, further comprising a feedback capacitor coupled between an output of a second amplifier included in the multi-stage amplifier and an input of the first amplifier during at least one time interval.

25. A switched capacitor circuit as claimed in claim 21, further comprising a current-generating circuit coupled to the output node of the primary amplifier.

26. An amplifier circuit, comprising:

a first amplifier having
a first input switchably connected to sample an input signal during a first time interval, and
a first output;

a second amplifier having
a second input coupled to said first output to receive a first output signal from said first output,
a second output;

at least one switch coupled to at least one of said amplifiers that is configurable to switch said amplifier circuit between an input sample configuration having a conductor that is switchably connected to form a unity gain feedback loop between said first output and said first input during said first time interval, and an amplify configuration having a feedback capacitor that is switchably coupled between said second output and said first input during a second time interval; and a common-mode control circuit that is configured to switch between a first configuration having a first bandwidth during said first time interval and a second configuration having a second bandwidth during said second time interval.

27. A switched capacitor circuit, comprising:

a primary amplifier including:
a differential pair of commonly doped input transistors,
a cascode transistor coupled to an output of one of said input transistors to increase a voltage gain of the primary amplifier, and
a secondary amplifier coupled to said cascode transistor so as to increase the voltage gain of the primary amplifier beyond that provided by the cascode transistor, wherein said secondary amplifier has a biasing input coupled to a common current electrode of the differential pair of input transistors so that said biasing input is biased with respect to a signal at said common current electrode; and at least one switch arranged to sample an input signal of the switched capacitor circuit onto at least one input capacitor.

28. A switched capacitor circuit as claimed in claim 27, wherein the primary amplifier constitutes a first amplifier in a multi-stage amplifier.

29. A switched capacitor circuit as claimed in claim 28, further comprising a feedback capacitor coupled between an output of a second amplifier included in the multi-stage amplifier and an input of the first amplifier during at least one time interval.

30. A switched capacitor circuit as claimed in claim 27, further comprising a current-generating circuit coupled to an output node of the primary amplifier.

31. A switched capacitor circuit, comprising:

an amplifier including:
a differential input circuit having a pair of differential output nodes;
a pair of current-gain stages respectively coupled to the pair of output nodes of the differential input circuit;

at least one switch arranged to sample an input signal of the switched capacitor circuit onto at least one input capacitor; and a first shorting switch coupled to at least one of a pair of input nodes of the pair of current-gain stages to selectively at least partially disable at least one of the pair of current-gain stages to assist in disabling the amplifier.

32. A switched capacitor circuit as claimed in claim 31, wherein each of the pair of current-gain stages includes a current mirror.

33. A switched capacitor circuit as claimed in claim 31, further comprising a second shorting switch coupled to an output of the amplifier to assist in disabling the amplifier.

34. A switched capacitor circuit, comprising:
an amplifier;
at least one switch arranged to sample an input signal of the switched capacitor circuit onto at least one input capacitor; and
a common-mode control circuit that is configured to switch between a first configuration having a first bandwidth during a first time interval and a second configuration having a second bandwidth during a second time interval.

* * * * *